(12) United States Patent
Takakuwa et al.

(10) Patent No.: US 8,137,890 B2
(45) Date of Patent: Mar. 20, 2012

(54) COLORED PHOTOSENSITIVE COMPOSITION, COLOR FILTER, AND METHOD FOR MANUFACTURING COLOR FILTER

(75) Inventors: Hideki Takakuwa, Haibara-gun (JP); Kazuto Shimada, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 772 days.

(21) Appl. No.: 12/192,711

(22) Filed: Aug. 15, 2008

(65) Prior Publication Data
US 2009/0053626 A1    Feb. 26, 2009

(30) Foreign Application Priority Data
Aug. 22, 2007    (JP) .................................. 2007-216356

(51) Int. Cl.
- *G03F 7/00* (2006.01)
- *G03F 7/004* (2006.01)
- *G03F 7/027* (2006.01)
- *C08F 2/50* (2006.01)
- *C08J 3/28* (2006.01)

(52) U.S. Cl. ... 430/270.1; 430/7; 430/281.1; 430/286.1; 430/287.1; 522/10; 522/121; 522/39

(58) Field of Classification Search ............... 430/270.1, 430/7, 281.1, 286.1, 287.1; 522/10, 39, 121
See application file for complete search history.

(56) References Cited

U.S. PATENT DOCUMENTS

| | | | |
|---|---|---|---|
| 6,596,445 B1 * | 7/2003 | Matsumoto et al. ............... 430/7 |
| 7,416,835 B2 * | 8/2008 | Fujimaki ..................... 430/281.1 |
| 7,535,810 B2 * | 5/2009 | Ueda et al. .................. 369/59.19 |
| 7,794,917 B2 * | 9/2010 | Mori et al. .................. 430/281.1 |
| 2003/0215745 A1 * | 11/2003 | Fujimaki ..................... 430/280.1 |
| 2005/0106495 A1 * | 5/2005 | Fujimaki ..................... 430/270.1 |
| 2006/0229376 A1 * | 10/2006 | Hayashi et al. ..................... 522/6 |
| 2006/0257759 A1 * | 11/2006 | Okazaki et al. .................... 430/7 |
| 2007/0099096 A1 | 5/2007 | Sasaki et al. |
| 2008/0171272 A1 * | 7/2008 | Nakashima et al. ............... 430/7 |
| 2010/0045905 A1 * | 2/2010 | Nakashima et al. ........... 349/106 |

FOREIGN PATENT DOCUMENTS

| | | | |
|---|---|---|---|
| EP | 1449651 A2 * | 8/2004 |
| EP | 1 505 441 A2 | 2/2005 |
| JP | 02-199403 A | 8/1990 |
| JP | 3823579 B2 | 8/2000 |
| JP | 2006-276878 A | 10/2006 |
| JP | 2007156404 A * | 6/2007 |
| WO | 2008/081988 A1 | 7/2008 |

OTHER PUBLICATIONS

Machine translation of JP 2007-156404 (no date).*
EP Communication, dated Sep. 24, 2009, issued in corresponding EP Application No. 08161988.4, 7 pages.

* cited by examiner

*Primary Examiner* — Amanda C. Walke
(74) *Attorney, Agent, or Firm* — Sughrue Mion, PLLC

(57) ABSTRACT

The invention provides a colored photosensitive composition including: a coloring agent with a content of from 50% by weight to 80% by weight with respect to the total solid content of the composition; an oxime-based initiator with a content of from 5% by weight to 20% by weight with respect to the total solid content of the composition; and a resin containing at least one first structural unit represented by any one of the following formulae (1) to (3) containing an unsaturated double bond, and at least one second structural unit represented by the following formula (4) containing an acid group, wherein a ratio of the first structural unit to the second structural unit is 1.5 or more (molar ratio).

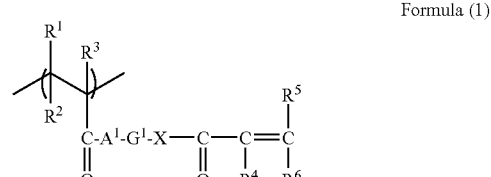

Formula (1)

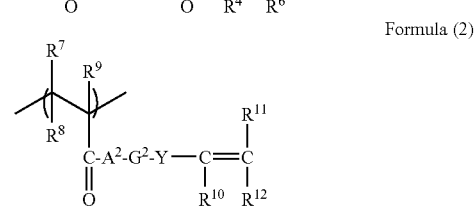

Formula (2)

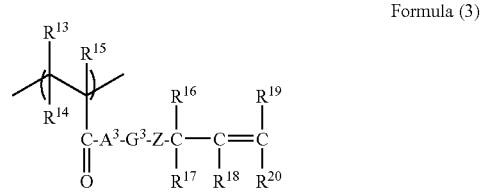

Formula (3)

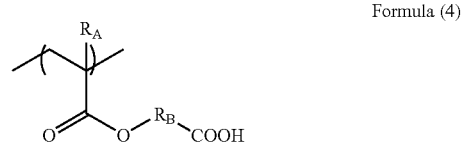

Formula (4)

13 Claims, No Drawings

COLORED PHOTOSENSITIVE COMPOSITION, COLOR FILTER, AND METHOD FOR MANUFACTURING COLOR FILTER

CROSS-REFERENCE TO RELATED APPLICATION

This application claims priority under 35 USC 119 from Japanese Patent Application No. 2007-216356, the disclosure of which is incorporated by reference herein.

BACKGROUND OF THE INVENTION

1. Field of the Invention

The present invention relates to a colored photosensitive composition, a color filter including the same, and a method for manufacturing the color filter, wherein the colored photosensitive composition is suitable for forming colored images in color filters used for liquid crystal display devices and solid-state image pickup devices such as CCD and CMOS.

2. Description of the Related Art

A dying method, a printing method, an electrodeposition method and a pigment dispersion method are known as methods for preparing a color filter that is used for liquid crystal display devices and solid-state image pickup devices.

Among these, the pigment dispersion method is a method where a color filter is prepared by photolithography with a colored photosensitive composition in which a pigment is dispersed in various photosensitive compositions and, since a pigment is used, this method is advantageous in terms of stability with respect to light and heat. Furthermore, since the photolithographic method is used for patterning, the method has high positioning precision, and has hitherto been widely used as a preferable method for producing color filters for large screens and high definition color displays.

When preparing a color filter by means of the pigment dispersion method, a photosensitive composition is applied to a glass substrate using a spin coater or a roll coater and dried to form a coated film and then the coated film is pattern-wise exposed and developed to form colored pixels. These steps are repeated for respective colors to obtain a color filter. As such a pigment dispersion method, a method that uses a negative-working photosensitive composition containing an alkali-soluble resin in combination with a photopolymerizable monomer and a photopolymerization initiator has been described (see, for example, Japanese Patent Application Laid-Open (JP-A) No. 2-199403).

In recent years, color filters for solid-state image pickup devices are required to have higher definition and smaller thickness. For example, as a technology for forming a thin film while maintaining spectral characteristics, there is disclosed a technique of increasing the content of coloring agents with respect to the total solid content in the colored photosensitive composition to improve pattern forming properties by the use of a resin (for example, see Japanese Patent Application Laid-Open (JP-A) No. 2006-276878 and Japanese Patent No. 3823579).

SUMMARY OF THE INVENTION

The present invention has been made in view of the above circumstances and provides a colored photosensitive composition, a color filter, and method for manufacturing the color filter.

An aspect of the present invention provides a colored photosensitive composition comprising: a coloring agent with a content of from 50% by weight to 80% by weight with respect to the total solid content; an oxime-based initiator with a content of from 5% by weight to 20% by weight with respect to the total solid content; and a resin containing at least one selected from the group consisting of a first structural unit represented by either one of the following formulae (1)-(3) containing an unsaturated double bond, and at least one selected from the group consisting of a second structural unit represented by the following formula (4) containing an acid group, wherein the ratio of the first structural unit to the second structural unit is 1.5 or more (molar ratio);

Formula (1)

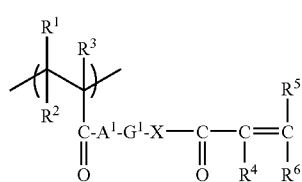

Formula (2)

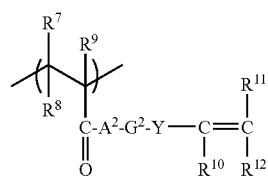

Formula (3)

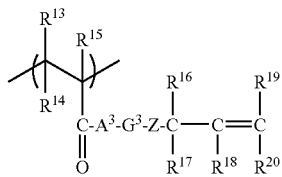

Formula (4)

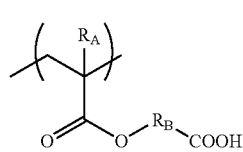

wherein $A^1$, $A^2$ and $A^3$ each independently represent an oxygen atom, a sulfur atom or $—N(R^{21})—$, in which $R^{21}$ represents an alkyl group which may have a substituent; $G^1$, $G^2$ and $G^3$ each independently represent a divalent organic group; X and Z each independently represent an oxygen atom, a sulfur atom or $—N(R^{22})—$, in which $R^{22}$ represents an alkyl group which may have a substituent; Y represents an oxygen atom, a sulfur atom, a phenylene group which may have a substituent or $—N(R^{23})—$, in which $R^{23}$ represents an alkyl group which may have a substituent; $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, $R^{20}$ each independently represent a monovalent substituent; $R_A$ represents a hydrogen atom or an alkyl group having 1 to 6 carbon atoms, and $R_B$ represents a divalent linking group.

DETAILED DESCRIPTION OF THE INVENTION

When an attempt is made to further increase the content of coloring agents while maintaining the formulations as described in Japanese Patent Application Laid-Open (JP-A) No. 2006-276878 and Japanese Patent No. 3823579, problems are generated in that sensitivity is extremely reduced and a pattern is peeled off in low exposure areas. When the addition amount of the polymerization initiator is increased in order to solve these problems, in particular, when a bayer pattern with a pattern size of 1.5 µm or less is formed, problems of occurrence of remarkable residues arise. Further, when coloring agents are used in combination with a resin having a low content of cross-linking groups, in particular, when the coloring agents are dyes, there are problems in that the pattern shape is collapses in a process of post-baking step, and there is occurrence of a normal tapered pattern, so that a rectangular pattern shape cannot be obtained.

The invention has been made in view of the above, and an object of the invention is to provide a colored photosensitive composition capable of preventing occurrence of a pattern peeling off and occurrence of residues during development (particularly, even if exposure is performed at a low exposure amount), and preventing collapse of a pattern during post-baking, and capable of providing a rectangular pattern, when a pattern (for example, a pattern with a small size (for example, 1.5 µm or less), particularly, a bayer pattern with a small size) is formed with an increased content of coloring agents, and also to provide a color filter having an excellent color hue and high definition, and a method for producing the color filter, and the subject of this invention is to achieve this object.

Hereinafter, specific means to attain the above-described object will be described.

<Colored Photosensitive Composition>

The colored photosensitive composition of the invention comprises at least (A) at least one coloring agent, (B) at least one resin, and (C) at least one oxime-based initiator, wherein a content of the coloring agents is from 50% by weight to 80% by weight with respect to the total solid content, and a content of the oxime-based initiators is from 5% by weight to 20% by weight with respect to the total solid content, and, preferably the colored photosensitive composition contains a polymerizable compound, and may further contain other components as needed.

Hereinafter, each constituent component for constituting the colored photosensitive composition of the invention (hereinafter, sometimes referred to as the "composition of the invention" in some cases) will be described in detail.

(A) Coloring Agent

In the invention, as the coloring agents, conventionally known pigments and dyes for color filters can be used without specific limitations.

The content of the coloring agents in the colored photosensitive composition is from 50% by weight to 80% by weight with respect to the total solid contents. Further, in view of absorbance due to the coloring agents and film-curing property, the content is preferably from 52% by weight to 75% by weight, and particularly preferably from 55% by weight to 70% by weight.

When the content of the coloring agents is high in such an amount in the colored photosensitive composition, particularly, adhesion of a pattern to a substrate decreases, and residues during development are apt to be deteriorated. Accordingly, in the case where the content of the coloring agent is from 50% by weight to 80% by weight, by the use of (B) a resin and (C) an oxime-based initiator, which will be described later, a rectangular pattern in a cross-sectional surface (in particular, the profile of a cut surface has a rectangular pattern when a pattern formed in a layer shape is cut with a plane in a direction perpendicular to the surface of the layer) can be obtained. Further, a composition is prepared by increasing the content of coloring agents contained in the composition to form a composition having a high absorbance, so that for example, when a color filter is prepared, color density and color purity of the color filter can be enhanced.

(Pigment)

Examples of the pigment which may be contained in the colored photosensitive composition of the invention may include various known inorganic pigments and organic pigments. The pigment preferably has a high transmittance. The pigment having a high transmittance refers to pigments having a small absorbance in a wavelength region from 600 nm to 700 nm when it is used for a red filter, a pigments having a small absorbance in a wavelength region of from 525 nm to 575 nm when it is used for a green filter, or a pigment having a small absorbance in a wave length region of from 425 nm to 475 nm when it is used for a blue filter.

Examples of the inorganic pigment include metal compounds such as metal oxides and metal complex salts, and specific examples thereof include metal oxides of iron, cobalt, aluminum, cadmium, lead, copper, titanium, magnesium, chromium, zinc, and antimony, and composition oxides thereof.

Examples of the organic pigment include: C. I. Pigment Yellow 11, 24, 31, 53, 83, 93, 99, 108, 109, 110, 138, 139, 147, 150, 151, 154, 155, 167, 180, 185, and 199; C. I. Pigment Orange 36, 38, 43, and 71; C. I. Pigment Red 81, 105, 122, 149, 150, 155, 171, 175, 176, 177, 209, 220, 224, 242, 254, 255, 264, and 270; C. I. Pigment Violet 19, 23, 32, and 39; C. I. Pigment Blue 1, 2, 15, 15:1, 15:3, 15:6, 16, 22, 60, and 66; C. I. Pigment Green 7, 36, and 37; C. I. Pigment Brown 25 and 28; C. I. Pigment Black 1 and 7; and carbon black.

In the invention, pigments containing a basic N atom in the structural formula thereof are particularly preferred. Such pigments containing a basic N atom exhibit good dispersibility in the colored photosensitive composition of the invention. The reason is not evident, but is likely due to the high affinity between the polymerizable component and the pigments.

Preferable examples of the pigment used in the invention include, but not limited to, the followings:

C. I. Pigment Yellow 11, 24, 108, 109, 110, 138, 139, 150, 151, 154, 167, 180, and 185; C. I. Pigment Orange 36 and 71; C. I. Pigment Red 122, 150, 171, 175, 177, 209, 224, 242, 254, 255, and 264; C. I. Pigment Violet 19, 23, and 32; C. I. Pigment Blue 15:1, 15:3, 15:6, 16, 22, 60, and 66; and C. I. Pigment Black 1.

These organic pigments may be used alone or in combination of two or more of them. When two or more of them are used in combination, color purity of the pigment can be improved. For example, in the case where the colored photosensitive composition of the invention is used for forming a color pattern in a color filter, it is preferable to use two or more pigments in combination. This further improves the color purity of the color pattern of the color filter.

Specific examples of the pigments and combination of the pigments are listed below.

Examples of the red pigment include an anthraquinone pigment, a perylene pigment, and a diketopyrrolopyrrole pigment, which may be used alone, or at least one of the red pigments may be combined with at least one selected from the group consisting of a disazo yellow pigment, an isoindoline yellow pigment, a quinophthalone yellow pigment, and a perylene red pigment.

Examples of the anthraquinone pigment include: C. I. Pigment Red 177; examples of the perylene pigment include C. I. Pigment Red 155 and C. I. Pigment Red 224; and examples of the diketopyrrolopyrrole pigment include C. I. Pigment Red 254.

In the invention, the combination of C. I. Pigment Yellow 139 with an anthraquinone pigment, perylene pigment, or diketopyrrolopyrrole pigment is preferred from the viewpoint of color reproducibility.

The weight ratio of the red pigment to the yellow pigment in the combination is preferably from 100/50 to 100/5. When the weight ratio is 100/5 or less, the light transmittance in the range from 400 nm to 500 nm can be suppressed, thereby facilitating further improvement of color purity. In addition, when the weight ratio is 100/50 or more, the shift of the dominant wavelength toward the shorter wavelength side can be prevented, and the amount of deviation from the intended NTSC hue is further decreased. The weight ratio is particularly preferably from 100/30 to 100/10. In the case where two or more red pigments are used in combination, the content ratio between them may be adjusted in accordance with the intended chromaticity.

Examples of the green pigment include a halogenated phthalocyanine pigment, which may be used alone or in combination with a disazo yellow pigment, a quinophthalone yellow pigment, an azomethine yellow pigment, or an isoindoline yellow pigment. Preferable examples of the combination include a combination of C. I. Pigment Green 7, 36, or 37 with C. I. Pigment Yellow 83, C.I. Pigment Yellow 138, C. I. Pigment Yellow 139, C. I. Pigment Yellow 150, C. I. Pigment Yellow 180, or C. I. Pigment Yellow 185. The weight ratio of the green pigment to the yellow pigment in the combination is preferably from 100/150 to 100/5, and particularly preferably from 100/120 to 100/30.

Examples of the blue pigment include a phthalocyanine pigment, which may be used alone or in combination with a dioxazine violet pigment. For example, a combination of C. I. Pigment Blue 15:6 and C. I. Pigment Violet 23 is preferred.

The weight ratio of the blue pigment to the violet pigment in the combination is preferably from 100/30 to 100/1, and more preferably from 100/10 to 100/1.

In the case of where the colored photosensitive composition of the invention is used for forming a black matrix of a color filter, examples of the pigment used therein include carbon, titanium carbon, iron oxide, or titanium oxide, which may be used alone or in combination. Among them, the combination of carbon and titanium carbon is preferred. The weight ratio of carbon to titanium carbon in the combination is preferably from 100/60 to 100/1.

In the case the colored photosensitive composition of the invention is used for a color filter, the primary particle diameter of the pigment as a coloring agent is preferably 100 nm or less from the viewpoint of color unevenness and contrast, and preferably 5 nm or more from the viewpoint of dispersion stability. The primary particle diameter of the pigment is more preferably from 5 nm to 75 nm, even more preferably from 5 nm to 55 nm, and particularly preferably from 5 nm to 35 nm. The primary particle diameter of the pigment may be measured by a known method such as electron microscopy.

In particular, the pigment is preferably selected from an anthraquinone pigment, an azomethine pigment, a benzylidene pigment, a cyanine pigment, a diketopyrrolopyrrole pigment, and a phthalocyanine pigment.

(Dye)

The coloring agent in the invention is preferably a dye from the viewpoint of forming a pattern with a higher definition. In particular, from the viewpoint of forming a fine rectangular pattern, it is preferable that a coloring agent be a dye soluble in an organic solvent, and more preferable that all of coloring agents be dyes soluble in an organic solvent.

Examples of the dye include known dyes, for example, dyes disclosed in JP-A Nos. 64-90403, 64-91102, 1-94301, and 6-11614, Japanese Patent No. 2592207, U.S. Pat. Nos. 4,808,501, 5,667,920, and 5,059,500, and JP-A No. 6-35183. Examples of the chemical structure of the dye include triphenylmethane, anthraquinone, benzylidene, oxonol, cyanine, phenothiazine, pyrrolopyrazole azomethine, xanthene, phthalocyanine, benzopyran, and indigo pigments. Particularly preferred are pyrazoleazo, anilinoazo, pyrazolotriazoleazo, pyridoneazo, and anthrapyridone dyes.

Other useful examples include a direct dye, a basic dye, a mordant dye, an acidic dye, an azoic dye, a dispersion dye, an oil-soluble dye, a food dye, and/or, derivatives thereof.

(Acidic Dye)

Among the above dyes, the acidic dye is further described below. The acidic dye in the invention is not particularly limited as long as the acidic dye is a dye having an acidic group such as a sulfo group, a carboxy group, or a phenolic hydroxy group within the dye molecule. The acidic dye is selected in consideration of all functions required, such as solubility in an organic solvent or developing solution, salt forming property with a basic compound, absorbance, interaction with other components in the composition of the invention, light fastness, and heat resistance.

Specific examples of the acidic dye include, but not limited to: Acid Alizarin Violet N; Acid Black 1, 2, 24, and 48; Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, and 340; Acid Chrome Violet K; Acid Fuchsin; Acid Green 1, 3, 5, 9, 16, 25, 27, 50, 58, 63, 65, 80, 104, 105, 106, and 109; Acid Orange 6, 7, 8, 10, 12, 26, 50, 51, 52, 56, 62, 63, 64, 74, 75, 94, 95, 107, 108, 169, and 173;

Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, and 426; Acid Violet 6B, 7, 9, 17, and 19; Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, and 251;

Direct Yellow 2, 33, 34, 35, 38, 39, 43, 47, 50, 54, 58, 68, 69, 70, 71, 86, 93, 94, 95, 98, 102, 108, 109, 129, 136, 138, and 141; Direct Orange 34, 39, 41, 46, 50, 52, 56, 57, 61, 64, 65, 68, 70, 96, 97, 106, and 107; Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, and 250; Direct Violet 47, 52, 54, 59, 60, 65, 66, 79, 80, 81, 82, 84, 89, 90, 93, 95, 96, 103, and 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, and 293; Direct Green 25, 27, 31, 32, 34, 37, 63, 65, 66, 67, 68, 69, 72, 77, 79, and 82; Mordant Yellow 5, 8, 10, 16, 20, 26, 30, 31, 33, 42, 43, 45, 56, 50, 61, 62, and 65; Mordant Orange 3, 4, 5, 8, 12, 13, 14, 20, 21, 23, 24, 28, 29, 32, 34, 35, 36, 37, 42, 43, 47, and 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, and 95; Mordant Violet 2, 4, 5, 7, 14, 22, 24, 30, 31, 32, 37, 40, 41, 44, 45, 47, 48, 53, and 58; Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, and 84; Mordant Green 1, 3, 4, 5, 10, 15, 19, 26, 29, 33, 34, 35, 41, 43, and 53; Food Yellow 3; and derivatives of these dyes.

Among these acidic dyes, preferred dyes are Acid Black 24; Acid Blue 23, 25, 29, 62, 80, 86, 87, 92, 138, 158, 182, 243, and 324:1; Acid Orange 8, 51, 56, 74, and 63; Acid Red 1, 4, 8, 34, 37, 42, 52, 57, 80, 97, 114, 143, 145, 151, 183, 217, and 249; Acid Violet 7; Acid Yellow 17, 25, 29, 34, 42, 72, 76, 99, 111, 112, 114, 116, 134, 155, 169, 172, 184, 220, 228, 230, 232, and 243; Acid Green 25; and derivatives of these dyes.

The derivative of the acidic dye may be an inorganic salt of an acidic dye having a sulfo group or a carboxy group, a salt and/or an amide compound with a nitrogen-containing compound, and is not particularly limited as long as it is soluble in the composition of the invention. The acidic dye derivative is selected in consideration of all functions required, such as solubility in an organic solvent or developing solution, absorbance, interaction with other components in the composition of the invention, light-fastness, and heat resistance.

The salt and amide compound of an acidic dye with a nitrogen-containing compound are further described below.

When an acidic dye forms a salt or amide compound with a nitrogen-containing compound, the acidic dye has an improved solubility (impart the solubility in an organic solvent) and improved heat resistance and light fastness.

The nitrogen-containing compound which forms a salt with an acidic dye, and the nitrogen-containing compound which forms an amide bond with an acidic dye are selected in consideration of the solubility of the salt or amide compound in an organic solvent or developing solution, salt forming properties, absorbance and color value of the dye, interaction with other components in the composition of the invention, and heat resistance and light fastness as a coloring agent.

From the viewpoint of absorbance and chromatic valence, the nitrogen-containing compound preferably has a smaller molecular weight, and the molecular weight is preferably 300 or less, more preferably 280 or less, and particularly preferably 250 or less.

The molar ratio (hereinafter referred to as "n") of the nitrogen-containing compound to the acidic dye in the salt thereof is described below. The "n" is a value that determines the molar ratio of an acidic dye molecule to a nitrogen-containing compound as a counter ion, and the value may be freely selected in accordance with the conditions of salt formation between the acidic dye and nitrogen-containing compound. Specifically, a value in the range of $0 < n \leq 5$ is frequently used in practical cases in accordance with the number of acidic functional groups in the acidic dye, and is selected in consideration of all functions required, such as solubility in an organic solvent or developing solution, salt forming properties, absorbance, interaction with other components in the composition of the invention, light fastness, and heat resistance. From the viewpoint of absorbance, the value "n" is preferably in the range of $0 < n \leq 4.5$, more preferably in the range of $0 < n \leq 4$, and particularly preferably in the range of $0 < n \leq 3.5$.

The photosensitive composition of the invention is particularly preferably composed of a dye having two or more hydrogen bond donors as a coloring agent from the viewpoint of reducing development residues. Specific examples of the dye include the dyes described in JP-A No. 2006-243040. The colored photosensitive composition of the invention particularly preferably contains at least one phthalocyanine dye soluble in an organic solvent as a coloring agent from the viewpoints of light fastness and heat resistance. In the invention, a phthalocyanine dye soluble in an organic solvent can be favorably used without particular limitation.

Examples of the phthalocyanine dye soluble in an organic solvent include the dyes described in JP-A Nos. 5-333207, 6-51115, and 6-194828. Particularly preferable examples of the organic solvent-soluble phthalocyanine dye include the dye compound represented by formula (I) described below.

(Dye Compound Represented by Formula (I))

The dye compound represented by formula (I) is explained below. The dye compound represented by the following formula (I) is an organic solvent-soluble phthalocyanine dye which has a favorable molar extinction coefficient ϵ and a favorable color value, and meets the requirement for high light fastness and high heat resistance at the same time.

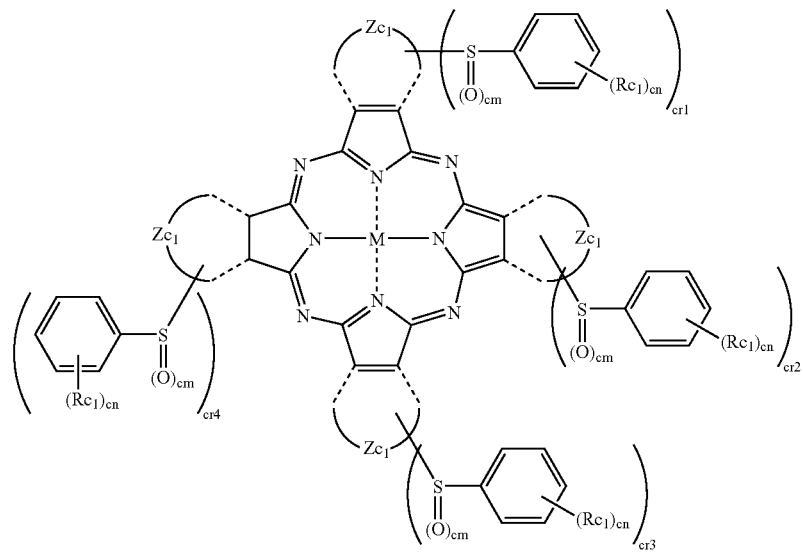

Formula (I)

In formula (I), $Rc_1$ represents a halogen atom, an aliphatic group, an aryl group, a heterocyclic group, a cyano group, a carboxy group, a carbamoyl group, an aliphatic oxycarbonyl group, an aryloxycarbonyl group, an acyl group, a hydroxy group, an aliphatic oxy group, an aryloxy group, an acyloxy group, a carbamoyloxy group, a heterocyclic oxy group, an aliphatic oxycarbonyloxy group, an N-alkylacylamino group, a carbamoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group, or a heterocyclic thio group. $Zc_1$ represents a group of nonmetal atoms necessary for forming a six-membered ring with carbon atoms, wherein the four $Zc_1$s may be identical or different from each other. M represents two hydrogen atoms, a divalent metal atom, a divalent metal oxide, a divalent metal hydroxide, or a divalent metal chloride. cm represents 0, 1, or 2, and cn represents 0 or an integer of from 1 to 5, wherein the four cns may be identical or different from each other. At least one cn represents an integer of from 1 to 5, and a plurality of $Rc_1$s in the molecule may be identical or different from each other. cr1, cr2, cr3, and cr4 each represent 0 or 1, and satisfy cr1+cr2+cr3+cr4≧1.

In formula (I), the "aliphatic group" is a group in which the aliphatic part thereof is straight chain, branched, or cyclic, wherein the group may be saturated or unsaturated. Examples thereof include an alkyl group, an alkenyl group, a cycloalkyl group, and a cycloalkenyl group, each of which may be unsubstituted or substituted by a substituent. The "aryl group" may be a monocycle or a condensed ring, and may be unsubstituted or substituted by a substituent. The "heterocyclic group" is a group in which the heterocyclic part thereof has a heteroatom (for example, nitrogen atom, sulfur atom, or oxygen atom) in the ring, wherein the group may be a saturated or unsaturated ring, may be a monocycle or a condensed ring, and may be unsubstituted or substituted by a substituent.

In formula (I), the "substituent" refers to a group capable of substitution, and examples thereof include an aliphatic group, an aryl group, a heterocyclic group, an acyl group, an imido group, an azo group, an acyloxy group, an acylamino group, an aliphatic oxy group, an aryloxy group, a heterocyclic oxy group, an aliphatic oxycarbonyl group, an aryloxycarbonyl group, a heterocyclic oxycarbonyl group, a carbamoyl group, an aliphatic sulfonyl group, an arylsulfonyl group, a heterocyclic sulfonyl group, an aliphatic sulfonyloxy group, an arylsulfonyloxy group, a heterocyclic sulfonyloxy group, a sulfamoyl group, an aliphatic sulfonamido group, an arylsulfonamido group, a heterocyclic sulfonamido group, an amino group, an aliphatic amino group, an arylamino group, a heterocyclic amino group, an aliphatic oxycarbonylamino group, an aryloxycarbonylamino group, a heterocyclic oxycarbonylamino group, an aliphatic sulfinyl group, an arylsulfinyl group, an aliphatic thio group, an arylthio group, a heterocyclic thio group, a hydroxy group, a cyano group, a sulfo group, a carboxy group, an aliphatic oxyamino group, an aryloxyamino group, a carbamoylamino group, a sulfamoylamino group, a halogen atom, a sulfamoylcarbamoyl group, a carbamoylsulfamoyl group, a dialiphatic oxyphosphinyl group, a diaryloxyphosphinyl group.

In formula (I), $Rc_1$ represents a halogen atom, an aliphatic group, an aryl group, a heterocyclic group, a cyano group, a carboxy group, a carbamoyl group, an aliphatic oxycarbonyl group, an aryloxycarbonyl group, an acyl group, a hydroxy group, an aliphatic oxy group, an aryloxy group, an acyloxy group, a carbamoyloxy group, a heterocyclic oxy group, an aliphatic oxycarbonyloxy group, an N-alkylacylamino group, a carbamoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group, or a heterocyclic thio group.

Examples of the halogen atom represented by $Rc_1$ include a fluorine atom, a chlorine atom, a bromine atom, and the like.

The aliphatic group represented by $Rc_1$ may be unsubstituted or substituted by a substituent, may be saturated or unsaturated, and may be cyclic. As the aliphatic group represented by $Rc_1$, an aliphatic group having 1 to 15 carbon atoms in total is preferred. Examples thereof include a methyl group, an ethyl group, a vinyl group, an allyl group, an ethynyl group, an isopropenyl group, a 2-ethylhexyl group, and the like.

The aryl group represented by $Rc_1$ may be unsubstituted or substituted by a substituent. As the aryl group represented by $Rc_1$, an aryl group having 6 to 16 carbon atoms in total is preferred, and an aryl group having 6 to 12 carbon atoms in total is more preferred. Examples thereof include a phenyl group, a 4-nitrophenyl group, a 2-nitrophenyl group, a 2-chlorophenyl group, a 2,4-dichlorophenyl group, a 2,4-dimethylphenyl group, a 2-methylphenyl group, a 4-methoxyphenyl group, a 2-methoxyphenyl group, a 2-methoxycarbonyl-4-nitrophenyl group, and the like.

The heterocyclic group represented by $Rc_1$ may be saturated or unsaturated. As the heterocyclic group represented by $Rc_1$, a heterocyclic group having 1 to 15 carbon atoms in total is preferred, and a heterocyclic group having 3 to 10 carbon atoms in total is more preferred. Examples thereof include a 3-pyridyl group, a 2-pyridyl group, a 2-pyrimidinyl group, a 2-pyrazinyl group, a 1-piperidinyl group, and the like. These groups may further have a substituent.

The carbamoyl group represented by $Rc_1$ may be unsubstituted or substituted by a substituent. As the carbamoyl group represented by $Rc_1$, a carbamoyl group having 1 to 16 carbon atoms in total is preferred, and a carbamoyl group having 1 to 12 carbon atoms in total is more preferred. Examples thereof include a carbamoyl group, a dimethylcarbamoyl group, a dimethoxyethylcarbamoyl group, and the like.

The aliphatic oxycarbonyl group represented by $Rc_1$ may be unsubstituted or substituted by a substituent, may be saturated or unsaturated, and may be cyclic. As the aliphatic oxycarbonyl group represented by $Rc_1$, an aliphatic oxycarbonyl group having 2 to 16 carbon atoms in total is preferred, and an aliphatic oxycarbonyl group having 2 to 10 carbon atoms in total is more preferred. Examples thereof include a methoxycarbonyl group, a butoxycarbonyl group, and the like.

The aryloxycarbonyl group represented by $Rc_1$ may be unsubstituted or substituted by a substituent. As the aryloxycarbonyl group represented by $Rc_1$, an aryloxycarbonyl group having 7 to 17 carbon atoms in total is preferred, and an aryloxycarbonyl group having 7 to 15 carbon atoms in total is more preferred. Examples thereof include a phenoxycarbonyl group and the like.

The acyl group represented by $Rc_1$ may be an aliphatic carbonyl group or an arylcarbonyl group. In the case where the acyl group represents an aliphatic carbonyl group, the group may further have a substituent. In the case where the acyl group represents an arylcarbonyl group, the group may further have a substituent, may be saturated or unsaturated, and may be cyclic. The acyl group is preferably an acyl group having 2 to 15 carbon atoms in total, and more preferably an acyl group having 2 to 10 carbon atoms in total. Examples thereof include an acetyl group, a pivaloyl group, a benzoyl group, and the like. These groups may further have a substituent.

The aliphatic oxy group represented by $Rc_1$ may be unsubstituted or substituted by a substituent, may be saturated or unsaturated, and may be cyclic. The aliphatic oxy group is preferably an aliphatic oxy group having 1 to 12 carbon atoms in total, and more preferably an aliphatic oxy group having 1 to 10 carbon atoms in total. Examples thereof include a methoxy group, an ethoxyethoxy group, a phenoxyethoxy group, a thiophenoxyethoxy group, and the like.

The aryloxy group represented by $Rc_1$ may be unsubstituted or substituted by a substituent. As the aryloxy group represented by $Rc_1$, an aryloxy group having 6 to 18 carbon atoms in total is preferred, and an aryloxy group having 6 to 14 carbon atoms in total is more preferred. Examples thereof include a phenoxy group, a 4-methylphenoxy group, and the like.

The acyloxy group represented by $Rc_1$ may be unsubstituted or substituted by a substituent. As the acyloxy group represented by $Rc_1$, an acyloxy group having 2 to 14 carbon atoms in total is preferred, and an acyloxy group having 2 to 10 carbon atoms in total is more preferred. Examples thereof include an acetoxy group, a methoxyacetoxy group, a benzoyloxy group, and the like.

The carbamoyloxy group represented by $Rc_1$ may be unsubstituted or substituted by a substituent. As the carbamoyloxy group represented by $Rc_1$, a carbamoyloxy group having 1 to 16 carbon atoms in total is preferred, and a carbamoyloxy group having 1 to 12 carbon atoms in total is more preferred. Examples thereof include a dimethylcarbamoyloxy group, a diisopropylcarbamoyloxy group, and the like.

The heterocyclic oxy group represented by $Rc_1$ may be unsubstituted or substituted by a substituent. As the heterocyclic oxy group represented by $Rc_1$, a heterocyclic oxy group having 1 to 15 carbon atoms in total is preferred, and a heterocyclic oxy group having 3 to 10 carbon atoms in total is more preferred. Examples thereof include a 3-furyloxy group, a 3-pyridyloxy group, an N-methyl-2-piperidyloxy group, and the like.

The aliphatic oxycarbonyloxy group represented by $Rc_1$ may be unsubstituted or substituted by a substituent, may be saturated or unsaturated, and may be cyclic. As the aliphatic oxycarbonyloxy group, an aliphatic oxycarbonyloxy group having 2 to 16 carbon atoms in total is preferred, and an aliphatic oxycarbonyloxy group having 2 to 10 carbon atoms in total is more preferred. Examples thereof include a methoxycarbonyloxy group, a t-butoxycarbonyloxy group, and the like.

The N-alkylacylamino group represented by $Rc_1$ may be unsubstituted or substituted by a substituent. As the N-alkylacylamino group represented by $Rc_1$, an N-alkylacylamino group having 3 to 15 carbon atoms in total is preferred, and an N-alkylacylamino group having 3 to 12 carbon atoms in total is more preferred. Examples thereof include an N-methylacetylamino group, an N-ethoxyethylbenzoylamino group, an N-methylmethoxyacetylamino group, and the like.

The carbamoylamino group represented by $Rc_1$ may be unsubstituted or substituted by a substituent. As the carbamoylamino group represented by $Rc_1$, a carbamoylamino group having 1 to 16 carbon atoms in total is preferred, and a carbamoylamino group having 1 to 12 carbon atoms in total is more preferred. Examples thereof include an N,N-dimethylcarbamoylamino group, an N-methyl-N-methoxyethylcarbamoylamino group, and the like.

The sulfamoylamino group represented by $Rc_1$ may be unsubstituted or substituted by a substituent. As the sulfamoylamino group represented by $Rc_1$, a sulfamoylamino group having 0 to 16 carbon atoms in total is preferred, and a sulfamoylamino group having 0 to 12 carbon atoms in total is more preferred. Examples thereof include an N,N-dimethylsulfamoylamino group, an N,N-diethylsulfamoylamino group, and the like.

The aliphatic oxycarbonylamino group represented by $Rc_1$ may be unsubstituted or substituted by a substituent. As the aliphatic oxycarbonylamino group represented by $Rc_1$, an aliphatic oxycarbonylamino group having 2 to 15 carbon atoms in total is preferred, and an aliphatic oxycarbonylamino group having 2 to 10 carbon atoms in total is more preferred. Examples thereof include a methoxycarbonylamino group, a methoxyethoxycarbonylamino group, and the like.

The aryloxycarbonylamino group represented by $Rc_1$ may be unsubstituted or substituted by a substituent. As the aryloxycarbonylamino group represented by $Rc_1$, an aryloxycarbonylamino group having 7 to 17 carbon atoms in total is preferred, and an aryloxycarbonylamino group having 7 to 15 carbon atoms in total is more preferred. Examples thereof include a phenoxycarbonylamino group, a 4-methoxyphenoxycarbonylamino group, and the like.

The aliphatic sulfonylamino group represented by $Rc_1$ may be unsubstituted or substituted by a substituent, may be saturated or unsaturated, and may be cyclic. As the aliphatic sulfonylamino group, an aliphatic sulfonylamino group having 1 to 12 carbon atoms in total is preferred, and an aliphatic sulfonylamino group having 1 to 8 carbon atoms in total is more preferred. Examples thereof include a methanesulfonylamino group, a buthanesulfonylamino group, and the like.

The arylsulfonylamino group represented by $Rc_1$ may be unsubstituted or substituted by a substituent. As the arylsulfonylamino group represented by $Rc_1$, an arylsulfonylamino group having 6 to 15 carbon atoms in total is preferred, and an arylsulfonylamino group having 6 to 12 carbon atoms in total is more preferred. Examples thereof include a benzenesulfonylamino group, a 4-toluenesulfonylamino group, and the like.

The aliphatic thio group represented by $Rc_1$ may be unsubstituted or substituted by a substituent, may be saturated or unsaturated, and may be cyclic. As the aliphatic thio group, an aliphatic thio group having 1 to 16 carbon atoms in total is preferred, and an aliphatic thio group having 1 to 10 carbon atoms in total is more preferred. Examples thereof include a methylthio group, an ethylthio group, an ethoxyethylthio group, and the like.

The arylthio group represented by $Rc_1$ may be unsubstituted or substituted by a substituent. As the arylthio group represented by $Rc_1$, an arylthio group having 6 to 22 carbon atoms in total is preferred, and an arylthio group having 6 to 14 carbon atoms in total is more preferred. Examples thereof include a phenylthio group, a 2-t-butylphenylthio group, and the like.

The aliphatic sulfonyl group represented by $Rc_1$ may be unsubstituted or substituted by a substituent. As the aliphatic sulfonyl group represented by $Rc_1$, an aliphatic sulfonyl group having 1 to 15 carbon atoms in total is preferred, and an aliphatic sulfonyl group having 1 to 8 carbon atoms in total is more preferred. Examples thereof include a methanesulfonyl group, a butanesulfonyl group, a methoxyethanesulfonyl group, and the like.

The arylsulfonyl group represented by $Rc_1$ may be unsubstituted or substituted by a substituent. As the arylsulfonyl group represented by $Rc_1$, an arylsulfonyl group having 6 to 16 carbon atoms in total is preferred, and an arylsulfonyl group having 6 to 12 carbon atoms in total is more preferred. Examples thereof include a benzenesulfonyl group, a 4-t-butylbenzenesulfonyl group, a 4-toluenesulfonyl group, a 2-toluenesulfonyl group, and the like.

The sulfamoyl group represented by $Rc_1$ may be unsubstituted or substituted by a substituent. As the sulfamoyl group represented by $Rc_1$, a sulfamoyl group having 0 to 16 carbon atoms in total is preferred, and a sulfamoyl group having 0 to 12 carbon atoms in total is more preferred. Examples thereof include a sulfamoyl group, a dimethylsulfamoyl group, and the like.

The imido group represented by $Rc_1$ may be further condensed with a ring. As the imido group represented by $Rc_1$, an imido group having 3 to 22 carbon atoms in total is preferred, and an imido group having 3 to 15 carbon atoms in total is more preferred. Examples thereof include a succinimido group, a phthalimido group, and the like.

The heterocyclic thio group represented by $Rc_1$ may be unsubstituted or substituted by a substituent, and is a 5- to 7-membered ring. A heterocyclic thio group having 1 to 20 carbon atoms in total is preferred, and a heterocyclic thio group having 1 to 12 carbon atoms in total is more preferred. Examples thereof include a 3-furylthio group, a 3-pyridylthio group, and the like.

In formula (I) described above, $Zc_1$ represents a group of nonmetal atoms necessary for forming a six-membered ring together with carbon atoms, wherein the four $Zc_1$s may be identical or different from each other. The six-membered ring to be formed may be an aryl ring or a heterocycle, wherein the ring may be condensed, in which the condensed ring may further have a substituent. Examples of the six-membered ring include a benzene ring, a pyridine ring, a cyclohexene ring, a naphthalene ring, and the like. An embodiment in which the six-membered ring is a benzene ring is preferable.

In formula (I) described above, M represents two hydrogen atoms, a divalent metal atom, a divalent metal oxide, a divalent metal hydroxide, or a divalent metal chloride. As M, for example, VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, $Si(OH)_2$, $H_2$, and the like are described. An embodiment in which M is VO, Zn, Mn, Cu, Ni, or Co is preferable.

In formula (I) described above, cm represents 0, 1, or 2 (preferably 0), and cn represents 0 or an integer of from 1 to 5 (preferably 0 or 1). The four cns in the molecule may be identical or different from each other, wherein one of the cn represents an integer of from 1 to 5. When a plurality of $Rc_1$s is present in the molecule, the plurality of $Rc_1$s is may be identical or different from each other.

cr1, cr2, cr3, and cr4 each represent 0 or 1, and satisfy $cr1+cr2+cr3+cr4 \geq 1$. Among them, an embodiment in which the sum of cr1, cr2, cr3, and cr4 is 3 or 4 is preferable.

Among the dye compounds represented by formula (I) described above, a dye represented by the following formula (I-1) is preferred.

Formula (I-1)

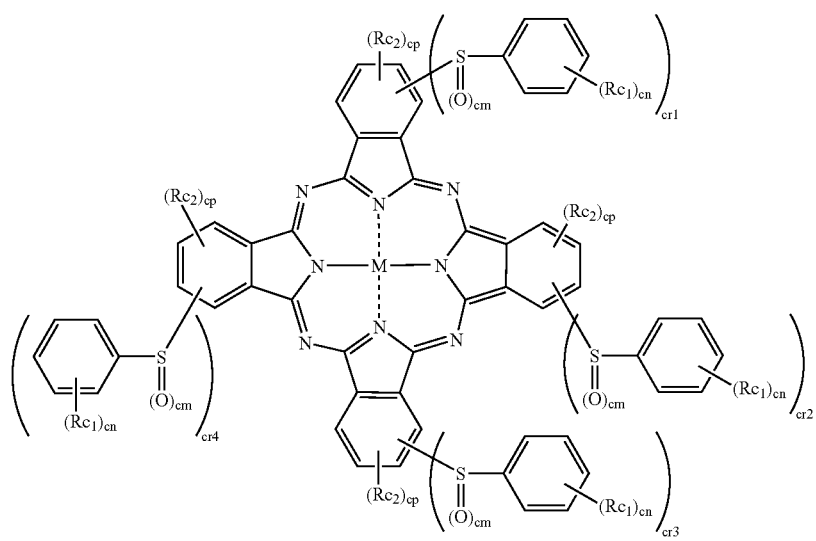

In formula (I-1), $Rc_2$ represents a substituent, and it is enough that the substituent is capable of substitution. Examples thereof include groups listed in the above-described section "Substituent". The substituent is preferably an aliphatic group, an aryl group, a heterocyclic group, an N-alkylacylamino group, an aliphatic oxy group, an aryloxy group, a heterocyclic oxy group, an aliphatic oxycarbonyl group, an aryloxycarbonyl group, a heterocyclic oxycarbonyl group, a carbamoyl group, an aliphatic sulfonyl group, a sulfamoyl group, an aliphatic sulfonamido group, an arylsulfonamido group, an aliphatic amino group, an arylamino group, an aliphatic oxycarbonylamino group, an aryloxycarbonylamino group, an aliphatic thio group, an arylthio group, a hydroxy group, a cyano group, a sulfo group, a carboxy group, a carbamoylamino group, a sulfamoylamino group, or a halogen atom, and more preferably an aliphatic group, an N-alkylacylamino group, an aliphatic oxy group, an aliphatic oxycarbonyl group, an aliphatic sulfonyl group, an aliphatic thio group, an arylthio group, a sulfo group, a carboxy group, or a halogen atom.

In formula (I-1), cp represents an integer of from 0 to 4, and is preferably 0 or 1. All of cp+cr1, cp+cr2, cp+cr3, and cp+cr4 represent an integer of from 0 to 4. When a plurality of $Rc_2$s is present in the molecule, the plurality of $Rc_2$s may be identical or different from each other.

$Rc_1$, M, cm, cn, cr1, cr2, cr3, and cr4 in formula (I-1) each have the same meaning as in formula (I) described above, and preferable exemplary embodiments thereof are also similar.

Among the dye compounds represented by formula (I-1) described above, a dye represented by the following formula (I-2) is more preferred.

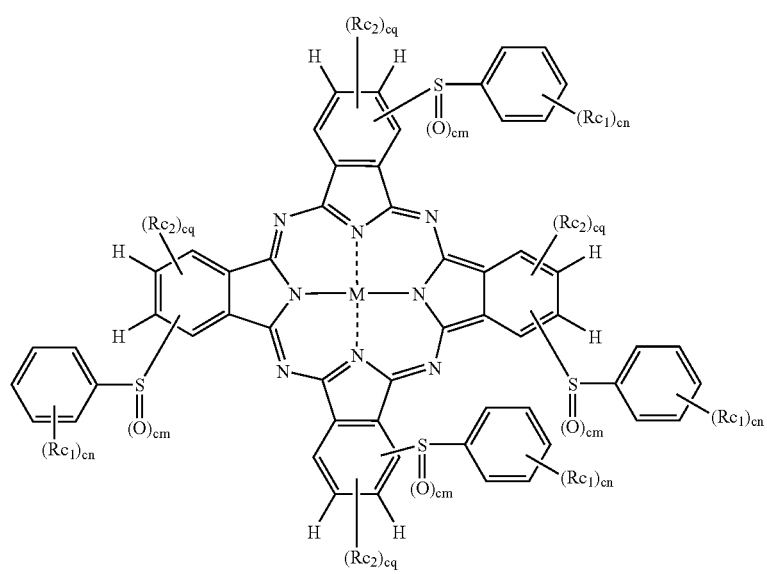

Formula (I-2)

In formula (I-2), $Rc_1$, $Rc_2$, M, cm, and cn each have the same meaning as in formulae (I) and (I-1) described above, and preferable exemplary embodiments thereof are also similar. cq in formula (I-2) represents 0 or 1. The phthalocyanine skeleton has a structure wherein four benzene rings are condensed on the outside of a tetraazaporphyrin skeleton, and each benzene ring has four substitutable sites (carbon atoms). In formula (I-2), hydrogen atoms combine with two sites (β sites) of each benzene ring, in which the two sites are placed far from the tetraazaporphyrin skeleton.

In formula (I-2), from the viewpoint of exhibiting the effect of the invention more effectively, an embodiment wherein $Rc_1$ is a halogen atom, an aliphatic group, a cyano group, a carbamoyl group, an aliphatic oxycarbonyl group, an aryloxycarbonyl group, a hydroxy group, an aliphatic oxy group, a carbamoyloxy group, a heterocyclic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic thio group, an arylthio group, an aliphatic sulfonyl group, an arylsulfonyl group, a sulfamoyl group, an imido group or a sulfo group is preferred, an embodiment wherein $Rc_1$ is an aliphatic group, a carbamoyl group, an aliphatic oxycarbonyl group, an aryloxycarbonyl group, an aliphatic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic sulfonyl group, an arylsulfonyl group, a sulfamoyl group, an imido group or a sulfo group is more preferred, and an embodiment wherein $Rc_1$ is a carbamoyl group, an aliphatic oxycarbonyl group, an aliphatic oxy group, an aliphatic oxycarbonyloxy group, a carbamoylamino group, an aliphatic oxycarbonylamino group, an arylsulfonyl group, an imido group or an aliphatic sulfonyl group is most preferred.

Similarly, from the viewpoint of exerting the effect of the invention more effectively, $Rc_2$ is preferably an aliphatic group, an N-alkylacylamino group, an aliphatic oxy group, an aliphatic oxycarbonyl group, an aliphatic sulfonyl group, an aliphatic thio group, an arylthio group, a sulfo group, a carboxy group, or a halogen atom, and more preferably an aliphatic group or a halogen atom. Similarly, from the viewpoint of exhibiting the effect of the invention more effectively, cq is preferably 0, Similarly, from the viewpoint of exhibiting the effect of the invention more effectively, M is preferably VO, Mn, Co, Ni, Cu, Zn, or Mg, more preferably VO, Co, Cu, or Zn, and most preferably Cu. cm is preferably 0. Further, cn is preferably 1 or 2, and more preferably 1.

From the viewpoint of exhibiting the effect of the invention even more effectively, in formula (I-2) described above, an embodiment wherein $Rc_1$ is a halogen atom, an aliphatic group, a cyano group, a carbamoyl group, an aliphatic oxycarbonyl group, an aryloxycarbonyl group, a hydroxy group, an aliphatic oxy group, a carbamoyloxy group, a heterocyclic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic thio group, an arylthio group, an aliphatic sulfonyl group, an arylsulfonyl group, a sulfamoyl group, an imido group or a sulfo group; M is VO, Co, Cu or Zn; cq is 0; cm is 0; and cn is 1 is preferred. Moreover, in formula (I-2) described above, an embodiment wherein $Rc_1$ is an aliphatic group, a carbamoyl group, an aliphatic oxycarbonyl group, an aryloxycarbonyl group, an aliphatic oxy group, an aliphatic oxycarbonyloxy group, a carbamoylamino group, a sulfamoylamino group, an aliphatic oxycarbonylamino group, an aliphatic sulfonylamino group, an arylsulfonylamino group, an aliphatic sulfonyl group, an arylsulfonyl group, a sulfamoyl group, an imido group or a sulfo group; M is VO, Co, Cu or Zn; cq is 0; cm is 0; and cn is 1 is more preferred.

In particular, similarly from the viewpoint of the effect of the invention, in formula (I-2) described above, an embodiment wherein $Rc_1$ is a carbamoyl group, an aliphatic oxycarbonyl group, an aliphatic oxy group, a carbamoylamino group, an aliphatic oxycarbonylamino group, an aliphatic sulfonyl group, an arylsulfonyl group or an imido group; $Rc_2$ is a hydrogen atom; M is Cu; cq is 0; cm is 0; and cn is 1 is most preferred.

Specific examples of the dye represented by formula (I), (I-1), or (I-2) described above (exemplary compounds C-1 to C-59) are shown below. However, the invention is not limited to them.

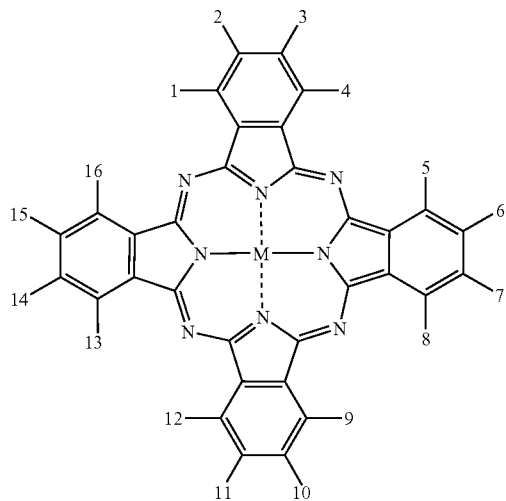

| Exemplary Compound | M | Substituents at 1 or 4; 5 or 8; 9 or 12; and 13 or 16 positions (Hs at other 4 positions) | Substituents at the other 8 positions |
|---|---|---|---|
| C-1 | Cu | —S—C₆H₄—C(O)N(CH₂CH₂OC₂H₅)₂ | H |
| C-2 | Cu | —S—C₆H₄—C(O)N(CH₂CH₂OCH₃)₂ | H |
| C-3 | Cu | —S—C₆H₄—C(O)OCH₃ | H |
| C-4 | Cu | —S—C₆H₄—C(O)N(CH₃)CH₂CH₂OCH₃ | H |
| C-5 | Cu | —S—C₆H₄—C(O)OCH(CH₃)CH₂OCH₃ | H |
| C-6 | Cu | —S—C₆H₄—C(O)N(C₂H₅)CH₂CH₂OCH₃ | H |
| C-7 | Cu | —S—C₆H₄—C(O)N(C₂H₅)₂ | H |
| C-8 | Cu | —S—C₆H₄—C(O)N(CH₃)₂ | H |

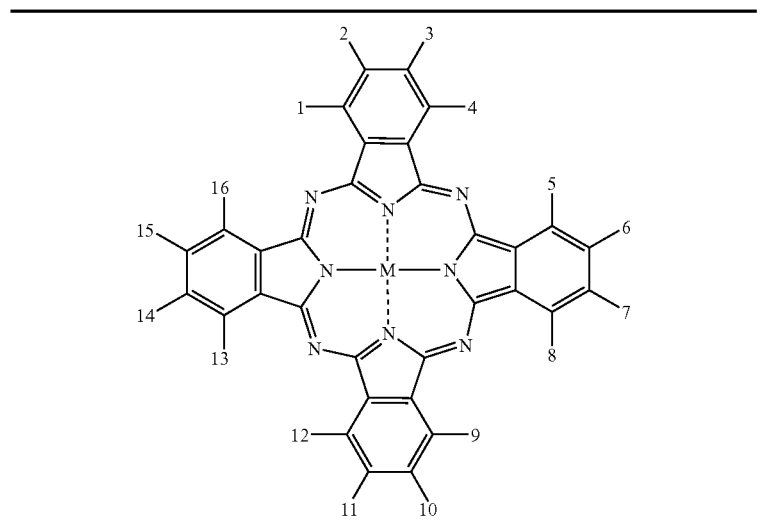
| Exemplary Compound | M | Substituents at 1 or 4; 5 or 8; 9 or 12; and 13 or 16 positions (Hs at other 4 positions) | Substituents at the other 8 positions |
|---|---|---|---|
| C-9 | Cu | 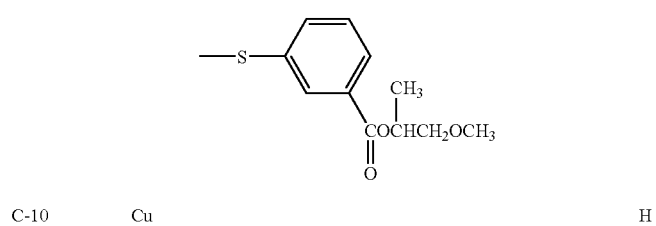 | H |
| C-10 | Cu | 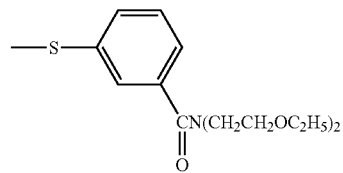 | H |
| C-11 | Cu | 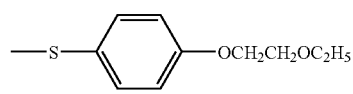 | H |
| C-12 | Cu | 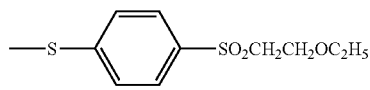 | Substituents at 2 or 3; 6 or 7; 10 or 11; and 14 or 15 positions are CH$_3$ (Hs at other 4 positions) |

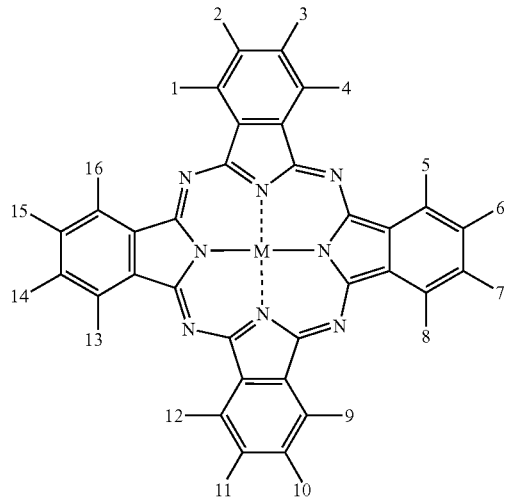
| Exemplary Compound | M | Substituents at 1 or 4; 5 or 8; 9 or 12; and 13 or 16 positions (Hs at other 4 positions) | Substituents at the other 8 positions |
|---|---|---|---|
| C-13 | Cu | | H |
| C-14 | Cu | 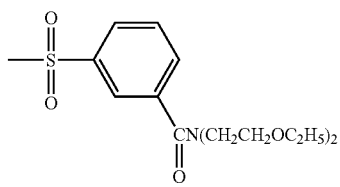 | H |
| C-15 | Cu | 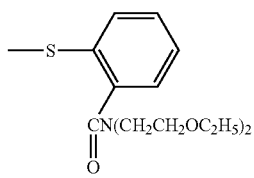 | Substituents at 2 or 3; 6 or 7; 10 or 11; and 14 or 15 positions are $CH_3$ (Hs at other 4 positions) 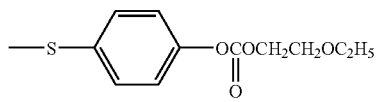 |

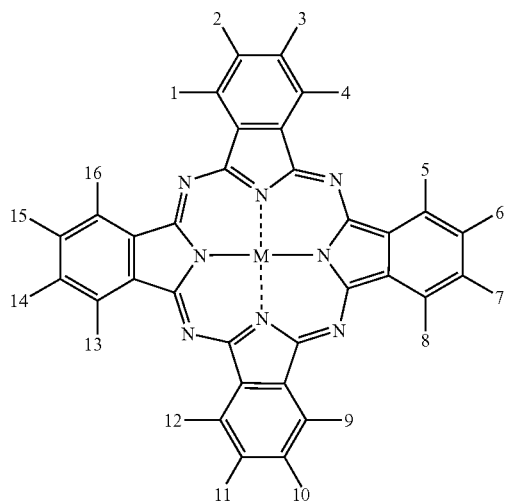
| Exemplary Compound | M | Substituents at 1 or 4; 5 or 8; 9 or 12; and 13 or 16 positiions (Hs at other 4 positions) | Substituents at the other 8 positions |
|---|---|---|---|
| C-16 | Cu | 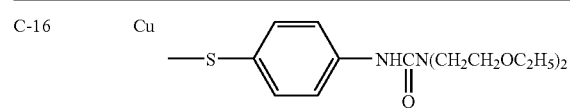 | H |
| C-17 | Cu | 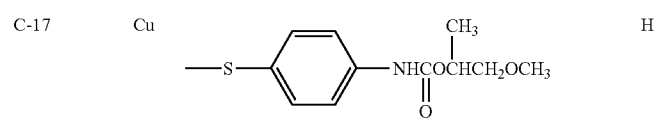 | H |
| C-18 | Cu | 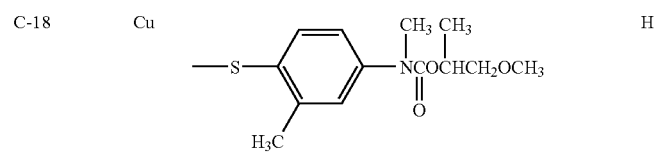 | H |
| C-19 | Cu | 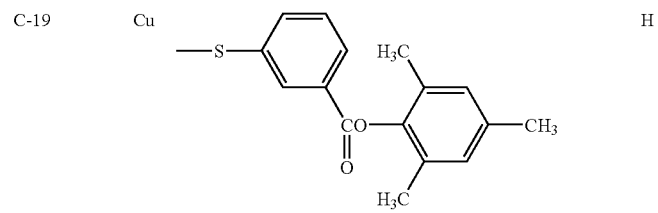 | H |
| C-20 | Cu | 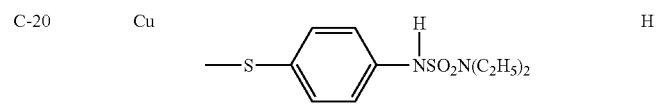 | H |
| C-21 | Cu | 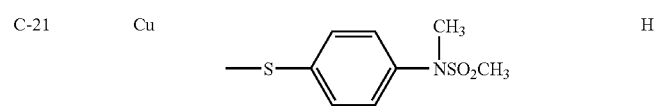 | H |
| C-22 | Cu | 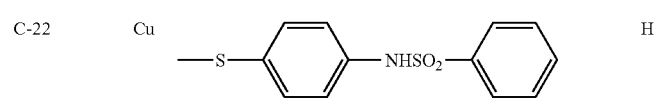 | H |

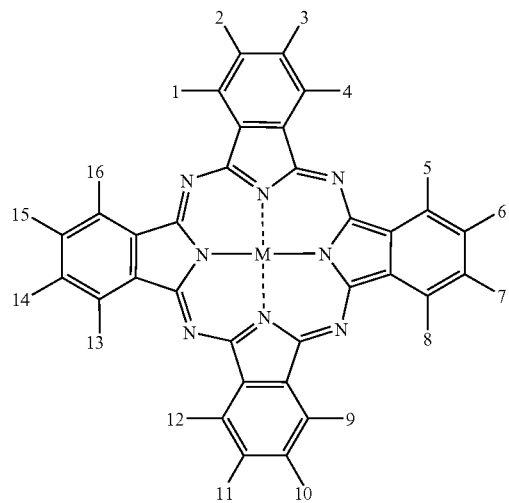
| Exemplary Compound | M | Substituents at 1 or 4; 5 or 8; 9 or 12; and 13 or 16 positions (Hs at other 4 positions) | Substituents at the other 8 positions |
|---|---|---|---|
| C-23 | Cu | 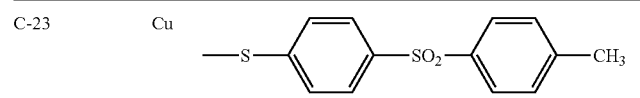 | H |
| C-24 | Cu | 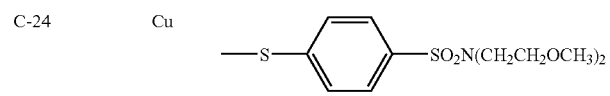 | H |
| C-25 | V=O | 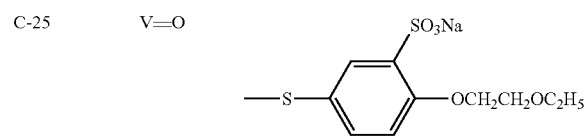 | H |
| C-26 | Cu | 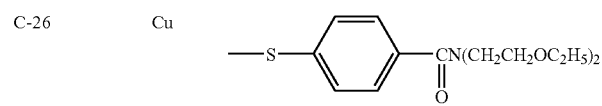 | H |
| C-27 | Cu | 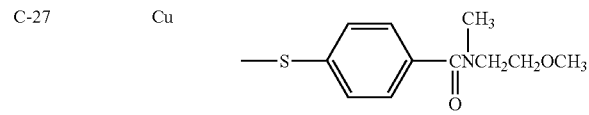 | H |
| C-28 | Cu | 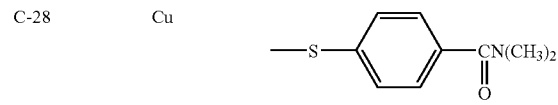 | H |
| C-29 | Zn | 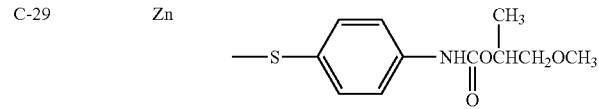 | H |
| C-30 | V=O | 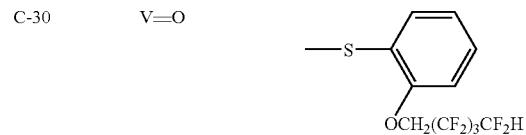 | H |

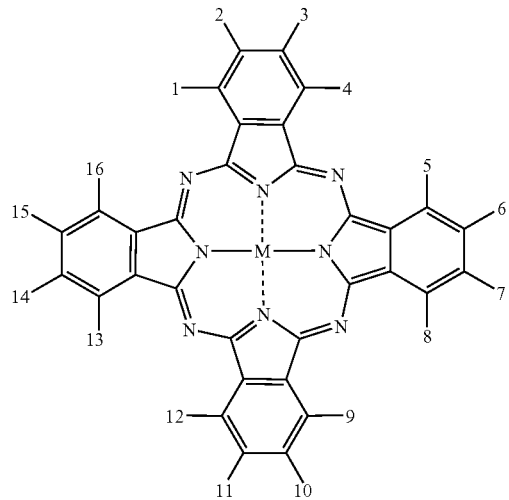
| Exemplary Compound | M | Substituents at 1 or 4; 5 or 8; 9 or 12; and 13 or 16 positions (Hs at other 4 positions) | Substituents at the other 8 positions |
|---|---|---|---|
| C-31 | Cu | 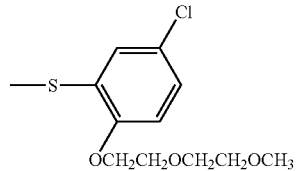 | H |
| C-32 | Cu | 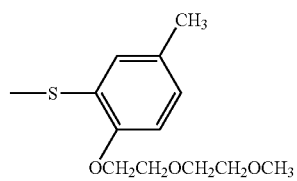 | H |
| C-33 | Cu | 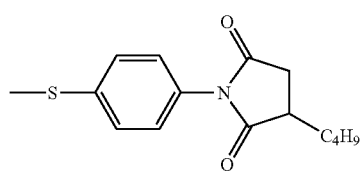 | H |
| C-34 | Cu | 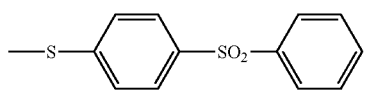 | H |
| C-35 | Cu | 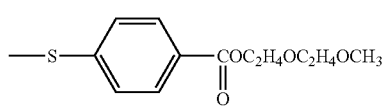 | H |

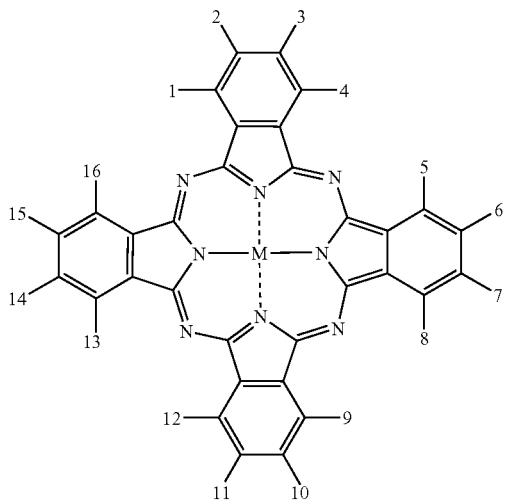
| Exemplary Compound | M | Substituents at 2 or 3; 6 or 7; 10 or 11; and 14 or 15 positions (Hs at other 4 positions) | Substituents at the other 8 positions |
|---|---|---|---|
| C-41 | Cu | 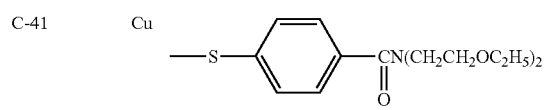 | H |
| C-42 | Cu | 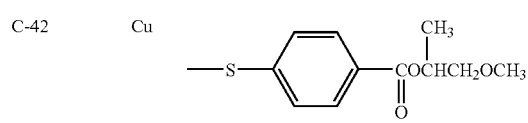 | H |
| C-43 | Cu |  | H |
| C-44 | Cu |  | H |
| C-45 | Cu |  | H |

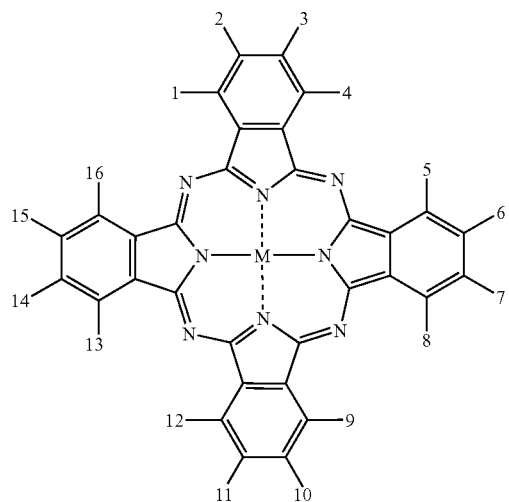
| Exemplary Compound | M | Substituents at 2 or 3; 6 or 7; 10 or 11; and 14 or 15 positions (Hs at other 4 positions) | Substituents at the other 8 positions |
|---|---|---|---|
| C-46 | Zn | 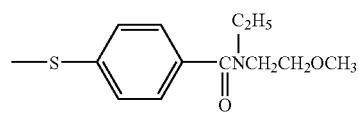 | H |
| C-47 | V=O | 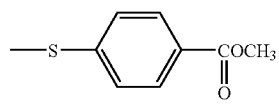 | H |
| C-48 | Cu | 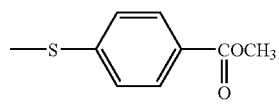 | Substituents at 1 or 4; 5 or 8; 9 or 12; and 13 or 16 positions are CH$_3$ (Hs at other 4 positions) |
| C-49 | Cu | 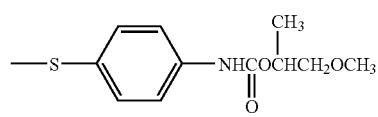 | H |

C-50
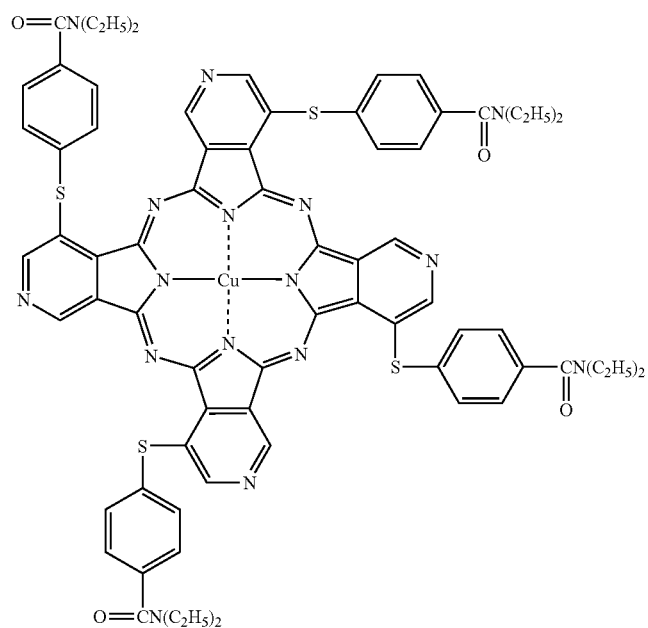
C-51
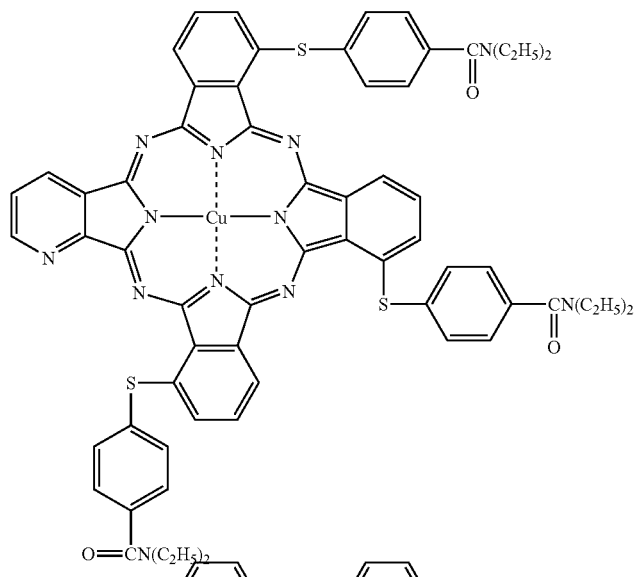
C-52
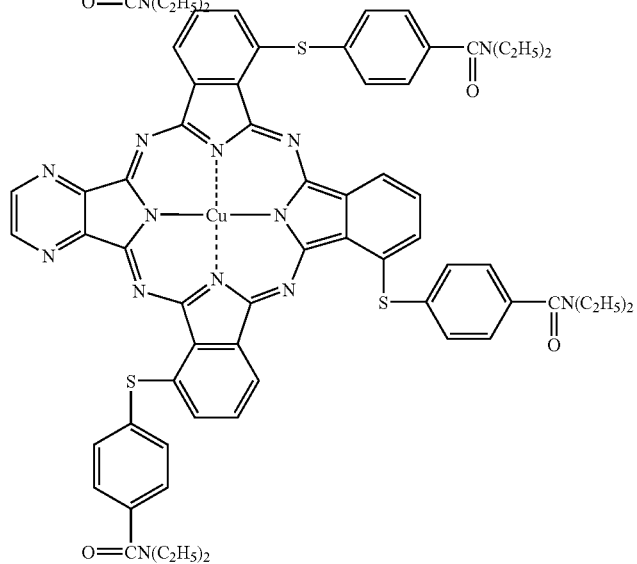

-continued
C-53
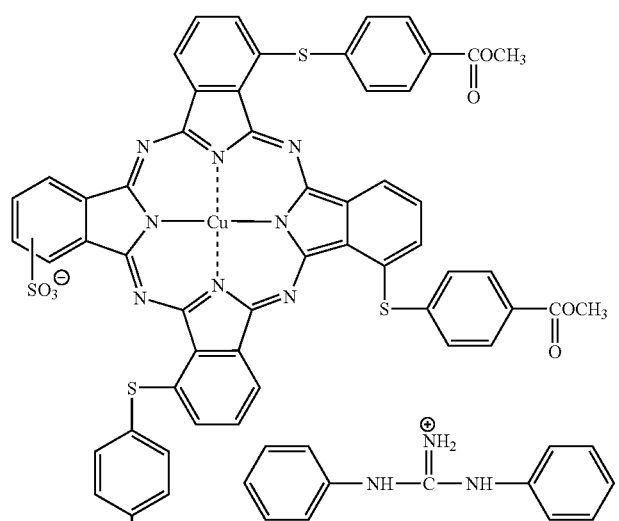
C-54
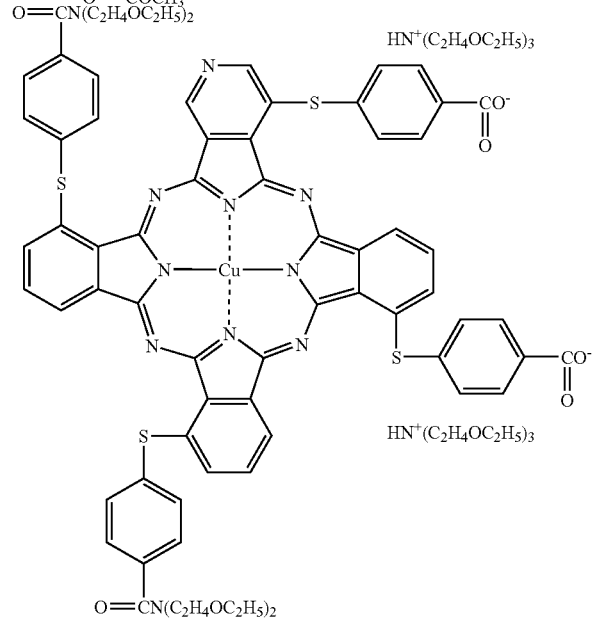
C-55
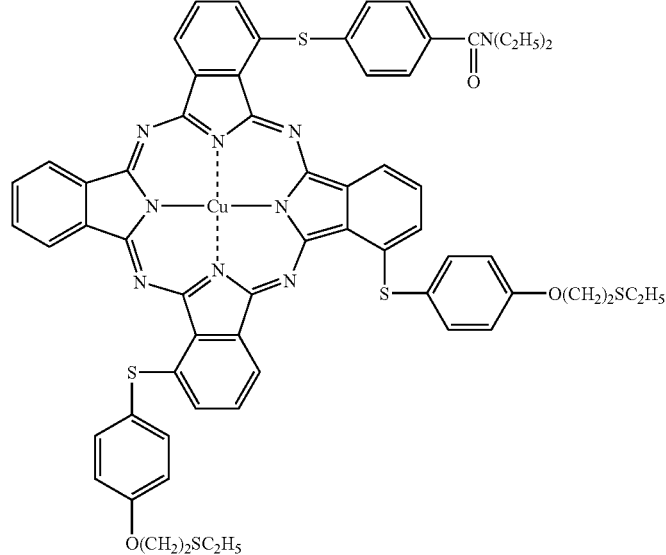

-continued
C-56
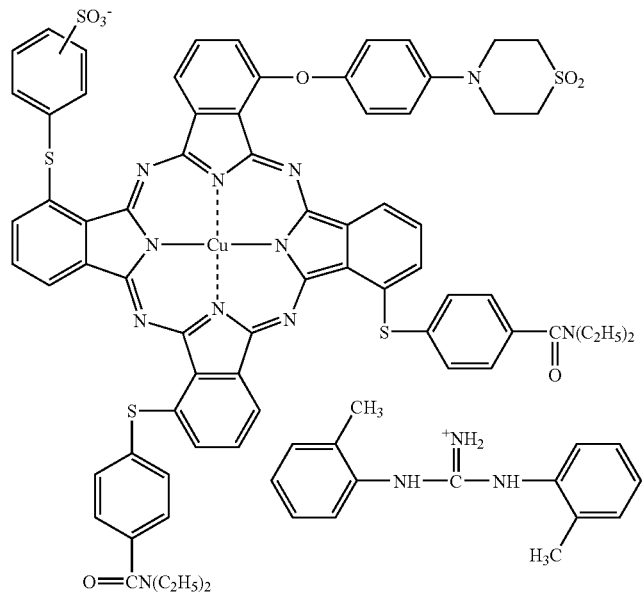
C-57
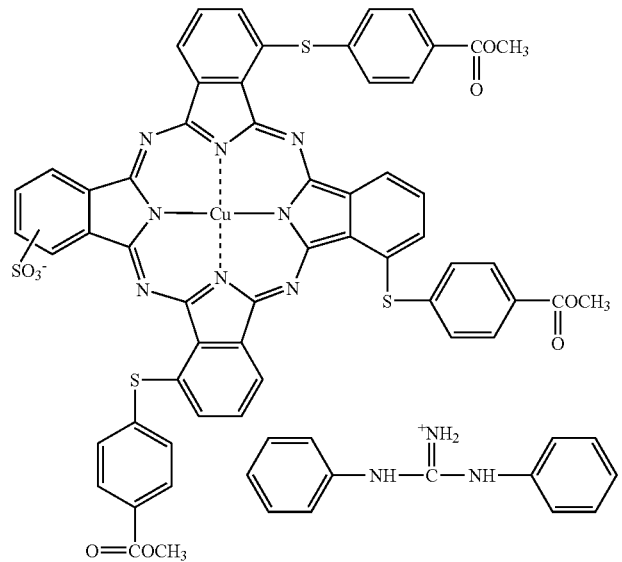

C-58

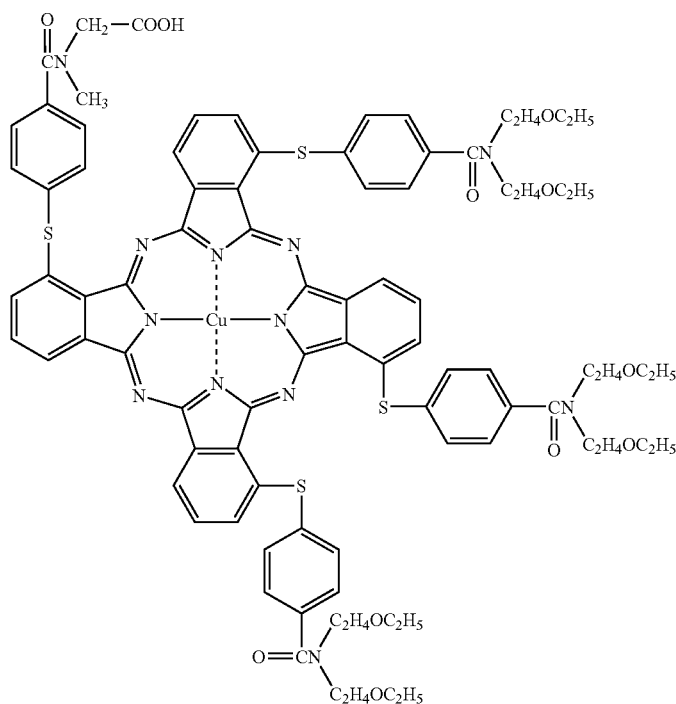

C-59

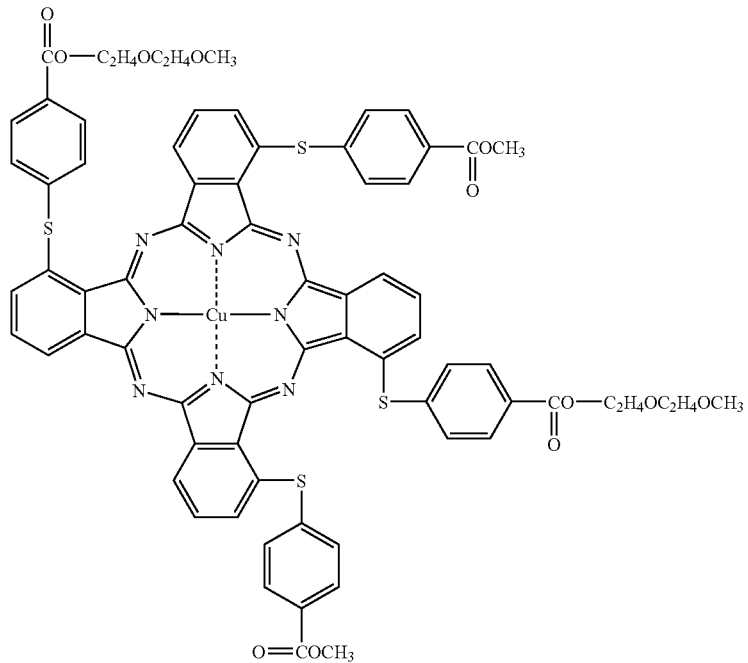

In the colored photosensitive composition of the invention, from the viewpoint that a fine pattern can be formed in a rectangular shape, it is preferred that all of the coloring agents are organic solvent soluble dyes. Further, the colored photosensitive composition contains preferably organic solvent soluble phthalocyanine dyes, and more preferably, the phthalocyanine dyes represented by formula (I), (I-1) or (I-2) above.

(B) Resin

The colored photosensitive composition of the invention includes at least one resin comprising at least one selected from the group consisting of a first structural unit represented by either one of the following formulae (1)-(3) containing an unsaturated double bond, and at least one selected from the group consisting of a second structural unit represented by the following formula (4) containing an acid group, wherein a ratio of the first structural unit to the second structural unit is 1.5 or more (molar ratio) (hereinafter, may be referred to as "the resin in the invention").

In the invention, by the use of the resin together with an oxime-based initiator, which will be described later, when a pattern with a small size, for example, with 5 µm or less, (particularly, bayer pattern) is formed by the use of a composition containing a coloring agent in a relatively large amount, occurrence of exfoliation of the pattern during development is prevented, and occurrence of residues is prevented, and further collapse in a pattern is prevented during post-baking, even if the light exposure amount at the time of exposure is reduced, so that a rectangular pattern can be formed. In particular, this is effective in the case where the content of coloring agent in the colored photosensitive composition is from 50% by weight to 80% by weight.

Since the resin of the invention has a first structural unit represented by either one of the following formulae (1)-(3), and has at least one of the first structural unit, the resin is effective for prevention of a pattern peeling off during exposure at a low exposure amount, and for prevention of collapse of a pattern during the post-baking.

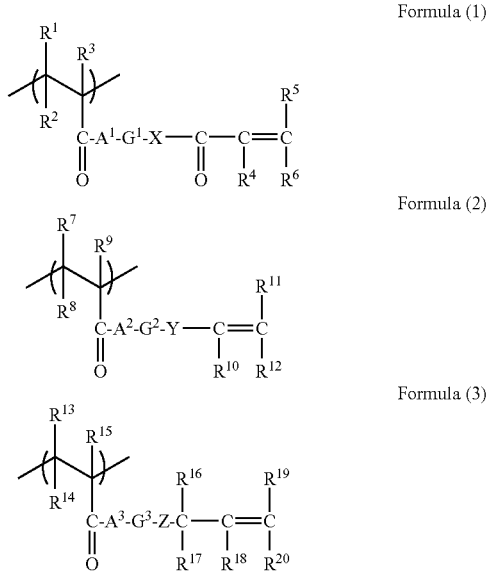

In formulae (1) to (3), $A^1$, $A^2$, and $A^3$ each independently represent an oxygen atom, a sulfur atom, or —N($R^{21}$)—, wherein $R^{21}$ represents an alkyl group which may have a substituent. $G^1$, $G^2$, and $G^3$ each independently represent a divalent organic group. X and Z each independently represent an oxygen atom, a sulfur atom, or —N($R^{22}$)—, wherein $R^{22}$ represents an alkyl group which may have a substituent. Y represents an oxygen atom, a sulfur atom, a phenylene group which may have a substituent, or —N($R^{23}$)—, wherein $R^{23}$ represents an alkyl group which may have a substituent. $R^1$ to $R^{20}$ each independently represent a monovalent substituent.

In formula (1), $R^1$ to $R^3$ each independently represent a monovalent substituent, and examples thereof include a hydrogen atom, an alkyl group which may further have a substituent, and the like. Among them, $R^1$ and $R^2$ are each preferably a hydrogen atom; and $R^3$ is preferably a hydrogen atom or a methyl group.

$R^4$ to $R^6$ each independently represent a monovalent substituent. $R^4$ represents, for example, a hydrogen atom, an alkyl group which may further have a substituent, or the like. Among them, a hydrogen atom, a methyl group, and an ethyl group are preferred. $R^5$ and $R^6$ each independently represent, for example, a hydrogen atom, a halogen atom, an alkoxycarbonyl group, a sulfo group, a nitro group, a cyano group, an alkyl group which may further have a substituent, an aryl group which may further have a substituent, an alkoxy group which may further have a substituent, an aryloxy group which may further have a substituent, an alkylsulfonyl group which may further have a substituent, or an arylsulfonyl group which may further have a substituent. Among them, a hydrogen atom, an alkoxycarbonyl group, an alkyl group which may further have a substituent, and an aryl group which may further have a substituent are preferred.

Herein, examples of the substituent which may be introduced include a methoxycarbonyl group, an ethoxycarbonyl group, an isopropyloxycarbonyl group, a methyl group, an ethyl group, a phenyl group, and the like.

$A^1$ represents an oxygen atom, a sulfur atom, or —N($R^{21}$)—, and X represents an oxygen atom, a sulfur atom, or —N($R^{22}$)—, wherein $R^{21}$ and $R^{22}$ each represent an alkyl group which may have a substituent.

$G^1$ represent a divalent organic group, and is preferably an alkylene group which may have a substituent, and more preferably a substituted or unsubstituted alkylene group having 1 to 20 carbon atoms, a substituted or unsubstituted cycloalkylene group having 3 to 20 carbon atoms, or a substituted or unsubstituted aromatic group having 6 to 20 carbon atoms. Among them, a straight-chain or branched, substituted or unsubstituted alkylene group having 1 to 10 carbon atoms, a substituted or unsubstituted cycloalkylene group having 3 to 10 carbon atoms, a substituted or unsubstituted aromatic group having 6 to 12 carbon atoms are preferred from the viewpoint of performance such as strength, development performance, and the like.

Preferable examples of the substituent in $G^1$ include a hydroxy group, and substituents excluding the substituents having a heteroatom to which a hydrogen atom other than a hydrogen atom in a hydroxy group is bonded (for example, an amino group, a thiol group, a carboxy group, or the like).

In the constituent unit represented by formula (1) described above, the case where $A^1$ is an oxygen atom, a sulfur atom, or —N($R^{21}$)—; X is an oxygen atom, a sulfur atom, or —N($R^{22}$)—; $G^1$ is an alkylene group which may have a substituent; $R^1$ and $R^2$ are each a hydrogen atom; $R^3$ is a hydrogen atom or a methyl group; $R^4$ is a hydrogen atom or an alkyl group; $R^5$ and $R^6$ are each independently a hydrogen atom, an alkoxycarbonyl group, an alkyl group, or an aryl group; and $R^{21}$ and $R^{22}$ are each an alkyl group is preferable.

In formula (2) described above, $R^7$ to $R^9$ each independently represent a monovalent substituent; and examples thereof include a hydrogen atom and an alkyl group which may further have a substituent. Among them, $R^7$ and $R^8$ are each preferably a hydrogen atom; and $R^9$ is preferably a hydrogen atom or a methyl group.

$R^{10}$ to $R^{12}$ each independently represent a monovalent substituent. Specific examples of the substituent include a hydrogen atom, a halogen atom, a dialkylamino group, an alkoxycarbonyl group, a sulfo group, a nitro group, a cyano group, an alkyl group which may further have a substituent, an aryl group which may further have a substituent, an alkoxy group which may further have a substituent, an aryloxy group which may further have a substituent, an alkylsulfonyl group which may further have a substituent, an arylsulfonyl group which may further have a substituent, and the like. Among them, a hydrogen atom, an alkoxycarbonyl group, an alkyl group which may further have a substituent, and an aryl group which may further have a substituent are preferred.

Examples of the substituent which may be introduced include those listed for formula (1).

$A^2$ represents an oxygen atom, a sulfur atom, or —N($R^{21}$)—, wherein $R^{21}$ represents, for example, a hydrogen atom, an alkyl group which may have a substituent, or the like.

$G^2$ represents a divalent organic group, and is preferably an alkylene group which may have a substituent. Preferable examples thereof include a substituted or unsubstituted alkylene group having 1 to 20 carbon atoms, a substituted or unsubstituted cycloalkylene group having 3 to 20 carbon atoms, a substituted or unsubstituted aromatic group having 6 to 20 carbon atoms, and the like. Among them, a straight-chain or branched, substituted or unsubstituted alkylene group having 1 to 10 carbon atoms, a substituted or unsubstituted cycloalkylene group having 3 to 10 carbon atoms, and a substituted or unsubstituted aromatic group having 6 to 12 carbon atoms are preferred from the viewpoint of performance such as strength, development performance, and the like.

Preferable examples of the substituent in $G^2$ include a hydroxy group, and substituents excluding the substituents having a heteroatom to which a hydrogen atom other than a hydrogen atom in a hydroxy group is bonded (for example, an amino group, a thiol group, a carboxy group, or the like).

When $G^2$ has a substituent having a heteroatom to which a hydrogen atom other than a hydrogen atom in a hydroxy group is bonded, storage stability may deteriorate by the combined use of an onium salt compound as an initiator described below.

Y represents an oxygen atom, a sulfur atom, —N($R^{23}$)—, or an phenylene group which may have a substituent. Herein, $R^{23}$ represents, for example, a hydrogen atom, an alkyl group which may have a substituent, or the like.

In the constituent unit represented by formula (2) described above, the case where $R^{10}$ is a hydrogen atom or an alkyl group; $R^{11}$ and $R^{12}$ are each independently a hydrogen atom, an alkoxycarbonyl group, an alkyl group, or an aryl group; $R^7$ and $R^8$ are each a hydrogen atom; $R^9$ is a hydrogen atom or a methyl group; $A^2$ is an oxygen atom, a sulfur atom, or —N($R^{21}$)—; $G^2$ is a straight-chain or branched, substituted or unsubstituted alkylene group having 1 to 10 carbon atoms, a substituted or unsubstituted cycloalkylene group having 3 to 10 carbon atoms, or a substituted or unsubstituted aromatic group having 6 to 12 carbon atoms; Y is an oxygen atom, a sulfur atom, —N($R^{23}$)—, or a phenylene group which may have a substituent; and $R^{21}$ and $R^{23}$ are each a hydrogen atom or an alkyl group which may have a substituent is preferable.

In formula (3) described above, $R^{13}$ to $R^{15}$ each independently represent a monovalent substituent, and examples thereof include a hydrogen atom, an alkyl group which may further have a substituent, and the like. Among them, $R^{13}$ and $R^{14}$ are each preferably a hydrogen atom; and $R^{15}$ is preferably a hydrogen atom or a methyl group.

$R^{16}$ to $R^{20}$ each independently represent a monovalent substituent. $R^{16}$ to $R^{20}$ each represent, for example, a hydrogen atom, a halogen atom, a dialkylamino group, an alkoxycarbonyl group, a sulfo group, a nitro group, a cyano group, an alkyl group which may further have a substituent, an aryl group which may further have a substituent, an alkoxy group which may further have a substituent, an aryloxy group which may further have a substituent, an alkylsulfonyl group which may further have a substituent, an arylsulfonyl group which may further have a substituent, or the like. Among them, a hydrogen atom, an alkoxycarbonyl group, an alkyl group which may further have a substituent, and an aryl group which may further have a substituent are preferred. Examples of the substituent which may be introduced include those listed for formula (1).

$A^3$ represents an oxygen atom, a sulfur atom, or —N($R^{21}$)—; and Z represents an oxygen atom, a sulfur atom, or —N($R^{22}$)—. Examples of $R^{21}$ and $R^{22}$ include those listed for formula (1).

$G^3$ represent a divalent organic group, and is preferably an alkylene group which may have a substituent. Preferable examples thereof include a substituted or unsubstituted alkylene group having 1 to 20 carbon atoms, a substituted or unsubstituted cycloalkylene group having 3 to 20 carbon atoms, a substituted or unsubstituted aromatic group having 6 to 20 carbon atoms, and the like. Among them, a straight-chain or branched, substituted or unsubstituted alkylene group having 1 to 10 carbon atoms, a substituted or unsubstituted cycloalkylene group having 3 to 10 carbon atoms, and a substituted or unsubstituted aromatic group having 6 to 12 carbon atoms are preferred from the viewpoint of performance such as strength, development performance, and the like.

Preferable examples of the substituent in $G^3$ include a hydroxy group, and substituents excluding the substituents having a heteroatom to which a hydrogen atom other than a hydrogen atom in a hydroxy group is bonded (for example, an amino group, a thiol group, a carboxy group, or the like).

In the constituent unit represented by formula (3) described above, it is preferred that $R^{13}$ and $R^{14}$ are each a hydrogen atom; $R^{15}$ is a hydrogen atom or a methyl group; $R^{16}$ to $R^{20}$ are each a hydrogen atom, an alkoxycarbonyl group, an alkyl group which may have a substituent, or an aryl group which may have a substituent; $A^3$ is an oxygen atom, a sulfur atom, or —N($R^{21}$)—; Z is an oxygen atom, a sulfur atom, or —N($R^{22}$)—; $R^{21}$ and $R^{22}$ are each an alkyl group; and $G^3$ is a straight-chain or branched, substituted or unsubstituted alkylene group having 1 to 10 carbon atoms, a substituted or unsubstituted cycloalkylene group having 3 to 10 carbon atoms, or a substituted or unsubstituted aromatic group having 6 to 12 carbon atoms.

The resin of the invention has a constitution in which the first structural unit represented by either one of the above-described formulae (1) to (3) is contained at a proportion of 1.5 times or more the second structural unit represented by the above-described formula (4), in order to suppress collapse in a pattern due to thermal sagging in the post-baking. In view of curing property, the first structural unit represented by either one of the above-described (1)-(3) is preferably contained at a proportion of 2 times or more the second structural unit represented by the above-described formula (4), and most preferably at a proportion of 3 times or more.

Further, in view of enhancing curing property and reducing development residues, the resin of the invention is a compound that contains preferably at least one selected from the first structural unit represented by either one of the (1)-(3) in a range of from 35 mol % to 95 mol % in a molecule, more preferably in a range of from 37 mol % to 90 mol %, and even more preferably, in a range of from 40 mol % to or 85 mol %. In particular, in view of curing property, the resin containing the structural unit represented by the above-mentioned formula (1) in a range of from 40 mol % to 85 mol % in a molecule is most preferable.

The synthesis of a polymer compound that can form the "first structural unit represented by either one of formulae (1) to (3) containing an unsaturated double bond" can be carried out in accordance with the synthetic methods described in Paragraph Nos. [0027]-[0057] of JP-A No. 2003-262958. Among them, the synthesis is preferably carried out in accordance with the synthetic method (1) in the publication.

The "polymer compound having an unsaturated double bond" is preferably a resin obtained by the below-described synthetic method (1) or (2).

(1) A polymer synthesized using the compound represented by the following formula (5) as a copolymerization component is allowed to react with a base to withdraw a proton to release L, and obtain the intended polymer compound having a structure represented by formula (1).

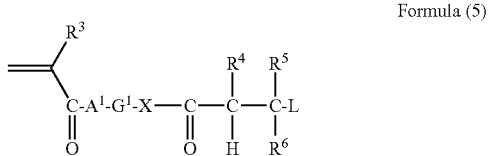

Formula (5)

In formula (5), L represents an anionic leaving group, and is preferably, for example, a halogen atom, an alkyl group, or an arylsulfonyloxy group. $R^3$ to $R^6$, $A^1$, $G^1$, and X each have the same meaning as in formula (1).

The base used to cause the elimination reaction may be an inorganic compound or an organic compound. The details and preferable exemplary embodiments of the method are described in JP-A No. 2003-262958, paragraphs [0028] to [0033].

Preferable examples of the inorganic compound base include sodium hydroxide, potassium hydroxide, sodium carbonate, sodium hydrogencarbonate, potassium carbonate, and potassium hydrogencarbonate, and examples of the organic compound base include metal alkoxide such as sodium methoxide, sodium ethoxide, and potassium t-butoxide, and organic amine compounds such as triethylamine, pyridine, and diisopropylethylamine.

(2) A polymer synthesized using the compound represented by the following formula (6) as a copolymerization component is subjected to base treatment to cause an elimination reaction with the specific functional group thereof, whereby $X^1$ is released to form a radical reactive group.

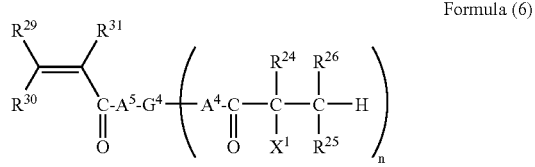

Formula (6)

In formula (6), $A^4$ represents an oxygen atom, a sulfur atom, or —N($R^{27}$)—; $A^5$ represents an oxygen atom, a sulfur atom, or —N$R^{28}$—, $R^{24}$, $R^{25}$, $R^{26}$, $R^{27}$, $R^{28}$, $R^{29}$, $R^{30}$, and $R^{31}$ each independently represent a hydrogen or a monovalent organic group; $X^1$ represents a group removed by an elimination reaction; and $G^4$ represents an organic linking group. n represents an integer number of from 1 to 10.

In formula (6), $A^4$ is preferably an oxygen atom, and A5 is preferably an oxygen atom. $R^{24}$ is preferably a methyl group; $R^{25}$, $R^{26}$, $R^{29}$, and $R^{30}$ are each preferably a hydrogen atom; and $R^{31}$ is preferably a methyl group or a hydrogen atom. In addition, $X^1$ is preferably a bromine atom, and $G^4$ is preferably an ethylene group.

The details and preferable exemplary embodiments of the methods are described in JP-A No. 2003-335814.

Examples of the resin obtained by the synthetic method (2) include polymer compounds described in JP-A No. 2003-335814, and specific preferable examples thereof include (i) polyvinyl polymer compounds, (ii) polyurethane polymer compounds, (iii) polyurea polymer compounds, (iv) poly(urethane-urea) polymer compounds, (V) polyester polymer compounds, (vi) polyamide polymer compounds, (vii) acetal-modified polyvinyl alcohol polymer compounds, and specific compounds obtained in accordance with these descriptions.

Specific examples of the compound represented by the above-mentioned formula (5) include the compounds (M-1) to (M-12) listed below, but the invention is not limited to them.

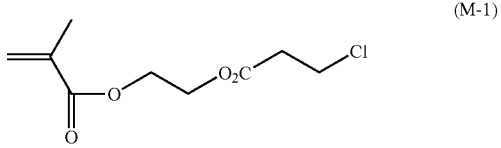
(M-1)

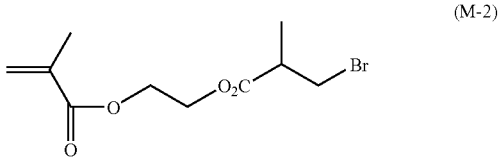
(M-2)

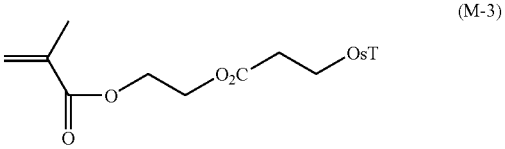
(M-3)

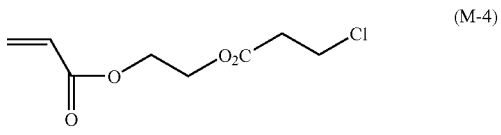
(M-4)

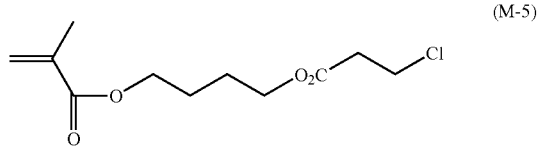
(M-5)

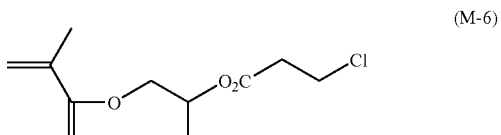
(M-6)

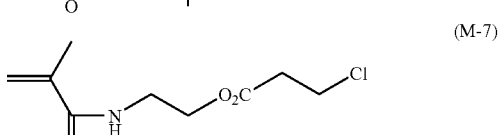
(M-7)

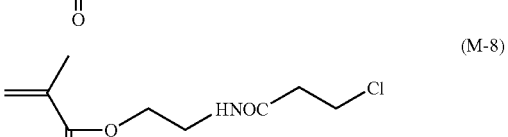
(M-8)

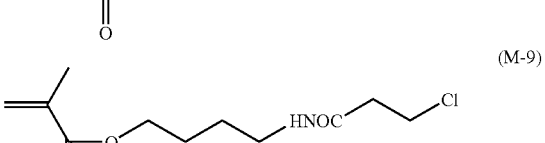
(M-9)

(M-10)
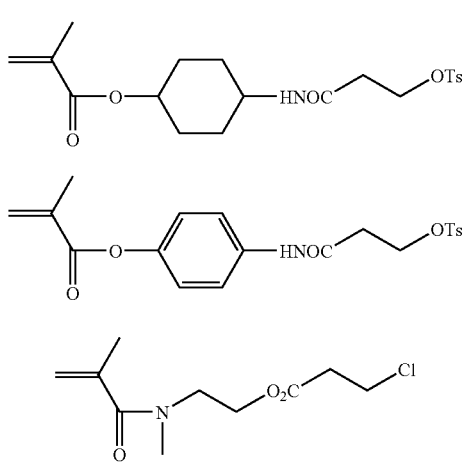
(M-11)
(M-12)
Examples of the compound represented by the above-described formula (6) include the compounds (i-1) to (i-52) listed below, but the invention is not limited to them.
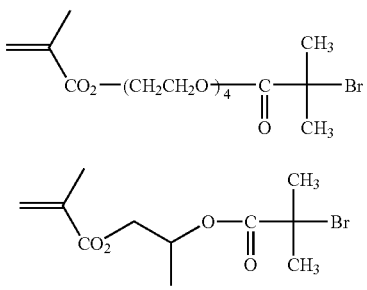
i-1
i-2
i-3
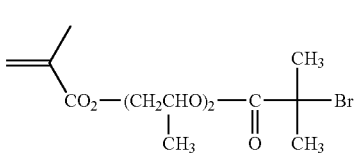
i-4
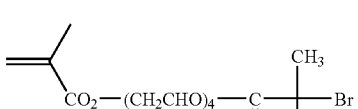
i-5
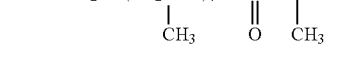
i-6
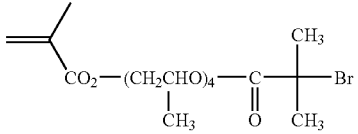
i-7
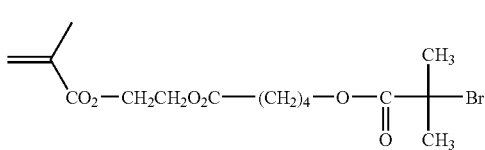
i-8
i-9
i-10
i-11
i-12
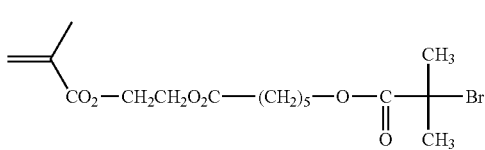
i-13
i-14
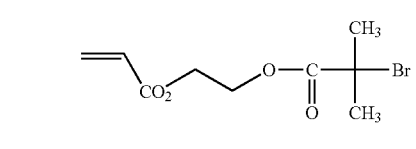
i-15
i-16
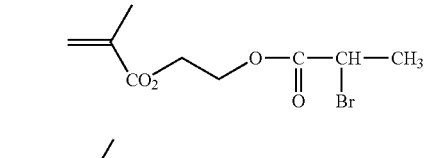
i-17
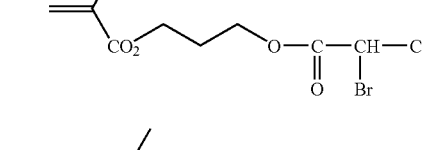
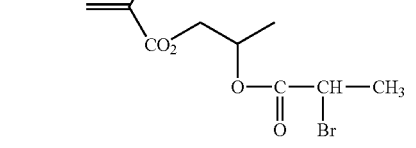
i-18

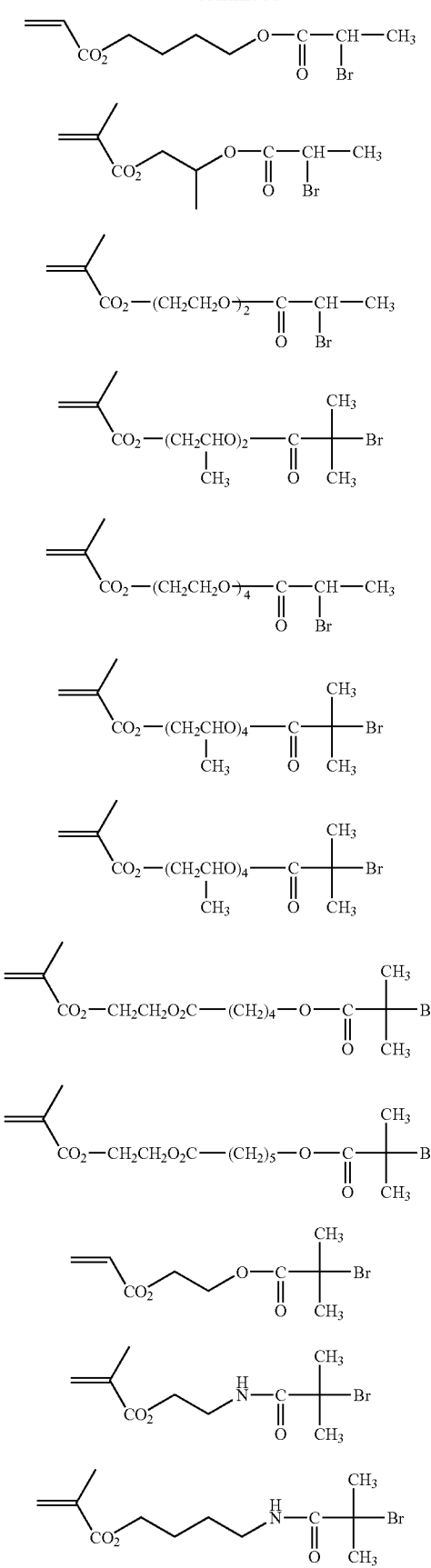
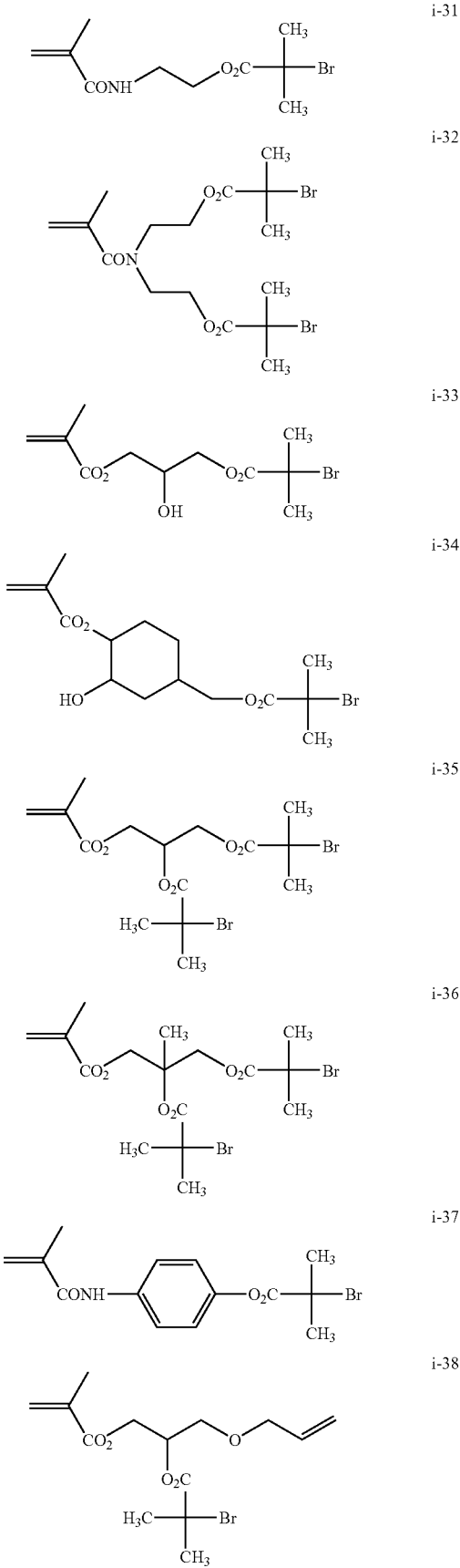

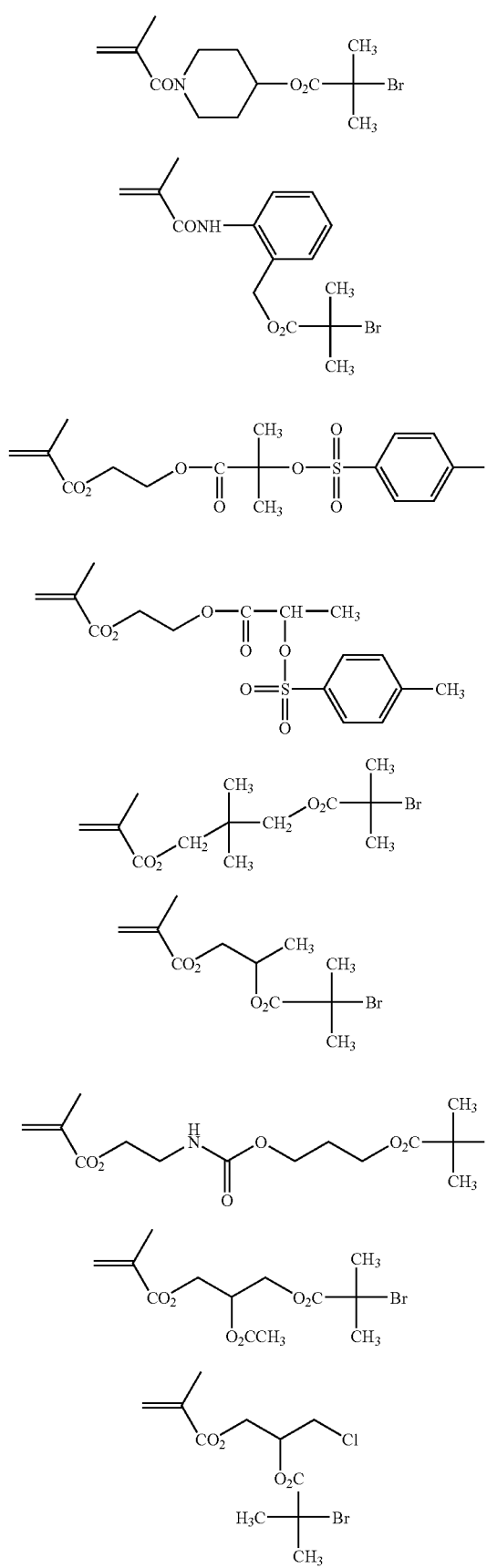

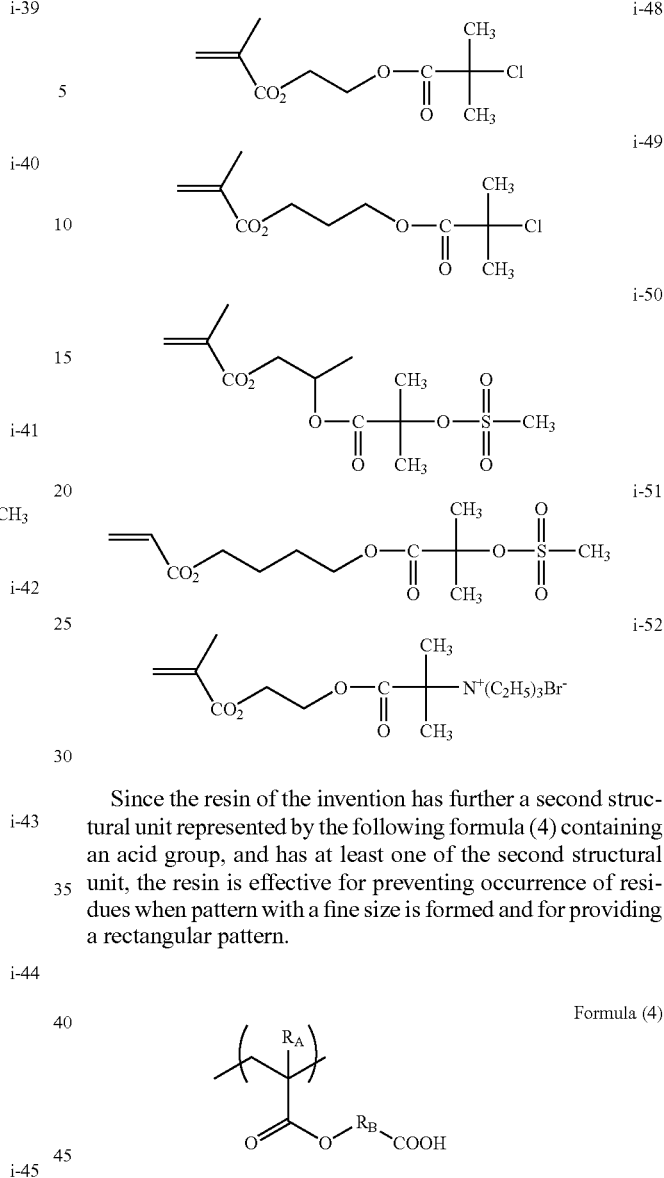

Since the resin of the invention has further a second structural unit represented by the following formula (4) containing an acid group, and has at least one of the second structural unit, the resin is effective for preventing occurrence of residues when pattern with a fine size is formed and for providing a rectangular pattern.

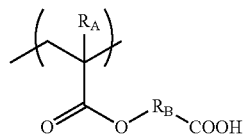

Formula (4)

In formula (4), $R_A$ represents a hydrogen atom or an alkyl group having 1 to 6 carbon atoms, and $R_B$ represents a divalent linking group.

The $R_A$ is preferably a hydrogen atom or a methyl group.

It is enough that $R_B$ is a divalent linking group, and $R_B$ is, for example, an alkylene group having 1 to 12 carbon atoms that may be substituted, —U—$R_C$—V— (wherein U and V each independently represent a single bond or an alkylene group having 1 to 3 carbon atoms, $R_C$ represents a cyclohexyl ring, benzene ring or naphthalene ring that may be substituted), or —$R_D$—X—$R_E$— ($R_D$ and $R_E$ each independently represent an alkylene group having 1 to 10 carbon atoms that may be substituted, or a benzene ring or naphthalene ring that may be substituted, and X represents an ester bond, an amide bond, a urethane bond, an ether bond, a thioether bond, a carbonate bond, a urea bond or an imide bond), and among them, it is preferable that $R_B$ is a divalent linking group having 1 to 6 carbon atoms.

Further, in the above-described formula (4), it is preferable that $R_A$ represents a methyl group and $R_B$ represents an alkylene group having 1 to 12 carbon atoms that may be substituted, —U—R$_c$—V— (wherein U and V each independently represent a single bond or an alkylene group having 1 to 3 carbon atoms, R$_c$ represents a cyclohexyl ring that may be substituted), or —R$_D$—X—R$_E$— (R$_D$ and R$_E$ each independently represent an alkylene group having 1 to 10 carbon atoms that may be substituted, and X represents an ester bond), and it is more preferable that R$_A$ represents a methyl group and R$_B$ represents a divalent linking group having 1 to 6 carbon atoms. Further, it is preferable that R$_A$ represents a methyl group and R$_B$ represents an alkylene group having 1-6 carbon atoms that may be substituted, or —R$_D$—X—R$_E$— (wherein R$_D$ and R$_E$ each independently represent an alkylene group having 1 to 6 carbon atoms that may be substituted, and X represents an ester bond).

Further, the resin in the invention has preferably an acid value of from 5 mg KOH/g to 70 mg KOH/g, more preferably 20 mg KOH/g to 60 mg KOH/g, and furthermore preferably 30 mg KOH/g to 50 mg KOH/g. When the acid value exceeds 70 mgKOH/g, a pattern peeling off is apt to take place during development, and when the acid value is less than 5 mgKOH/g, alkali developability is extremely deteriorated.

In the invention, the acid value, for example, can be calculated from an average content of the acid group in resin molecules. A resin having a desired acid value can be obtained by changing the content of monomer units containing acid groups for constituting the resin.

Specific compounds of the resins in the invention include, for example, the following polymer compounds 1-21 shown in the tables below.

| | Polymer compound | | Acid Value [mgKOH/g] | Mw |
|---|---|---|---|---|
| 1 | | | 54 | 85,000 |
| 2 | | | 49 | 36,000 |
| 3 | | | 34 | 62,000 |

-continued
| Polymer compound | Acid Value [mgKOH/g] | Mw |
|---|---|---|
| 4 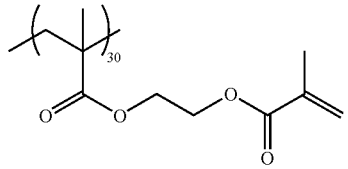 | 44 | 30,000 |
| 5 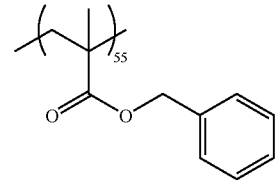 | 43 | 31,000 |
Mw: Weight average molecular weight
| Polymer compound | Acid Value [mgKOH/g] | Mw |
|---|---|---|
| 6 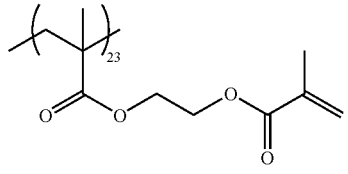 | 31 | 23,000 |
| 7 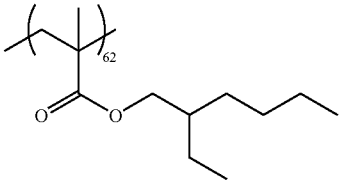 | 40 | 100,000 |

-continued

| Polymer compound | Acid Value [mgKOH/g] | Mw |
|---|---|---|
| 8 (structures) | 36 | 63,000 |
| 9 (structures) | 42 | 55,000 |
| 10 (structures) | 16 | 36,000 |

Mw: Weight average molecular weight

| Polymer compound | Acid Value [mgKOH/g] | Mw |
|---|---|---|
| 11 (structures) | 30 | 22,000 |

| | Polymer compound | Acid Value [mgKOH/g] | Mw |
|---|---|---|---|
| 12 | (structures) | 47 | 28,000 |
| 13 | (structures) | 16 | 53,000 |
| 14 | (structures) | 32 | 33,000 |
| 15 | (structures) | 15 | 30,000 |

Mw: Weight average molecular weight

| Polymer compound | Acid Value [mgKOH/g] | Mw |
|---|---|---|
| 16 (structures) | 6.0 | 61,000 |
| 17 (structures) | 45 | 48,000 |
| 18 (structures) | 58 | 27,000 |

Mw: Weight average molecular weight

| Polymer compound | Acid Value [mgKOH/g] | Mw |
|---|---|---|
| 19 (structures) | 55 | 35,000 |

-continued

| Polymer compound | Acid Value [mgKOH/g] | Mw |
|---|---|---|
| 20 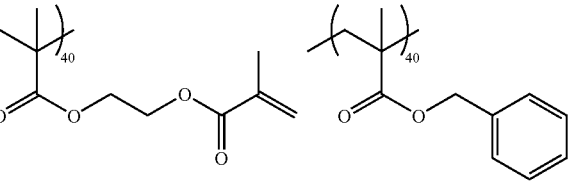 | 52 | 60,000 |
| 21 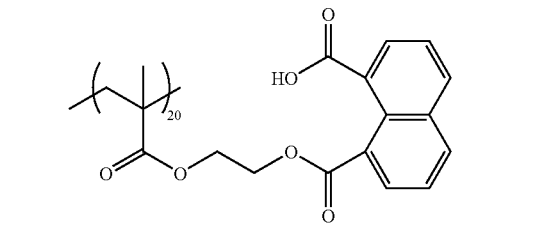 | 29 | 30,000 |

Mw: Weight average molecular weight

In view of preventing a pattern peeling off during development and developability, the weight-average molecular weight (Mw) of the resin in the invention is preferably from 30,000 to 300,000, more preferably from 35,000 to 250,000, furthermore preferably from 40,000 to 200,000, and particularly preferably from 45,000 to 100,000.

Here, the weight average molecular weight of the resin can be measured, for example, by a gel permeation chromatography (GPC).

In the GPC, the measurement is carried out by the following method. Namely, by the use of HLC-8020GPC (manufactured by Tosoh Corporation), three columns of TSK gel, Super Multipore HZ-H (4.6 mmID×15 cm; manufactured by Tosoh Corporation) as the columns, and THF(tetrahydrofuran) as an elute are used. Further, the measurement is performed using an IR detector under the conditions of a sample concentration of 0.35/min., a flow rate of 0.35 ml/min., an injection amount of sample of 10 μl, a measurement temperature of 40° C. Calibration curves can be prepared by eight samples of "Reference Sample TSK Standard, polystyrene" of "F-40", "F-20", "F-4", "F-1", "A-5000", "A-2500", "A-1000" and "n-propylbenzene".

In the invention, the content of the resin (B) in the colored photosensitive composition is preferably from 0.1% by weight to 7.0% by weight, more preferably from 0.3% by weight to 6.0% by weight, and furthermore preferably from 1.0% by weight to 5.0% by weight with respect to the total solid content in the composition, in view of compatibility of the suppression of a pattern peeling off with the reduction of development residues. In particular, this is effective when the content of the coloring agent in the colored photosensitive composition is from 50% by weight to 80% by weight.

(C) Oxime-Based Initiator

The colored photosensitive composition of the invention contains at least one oxime-based initiator as a photopolymerization initiator.

The content of the oxime-based initiator is from 5.0% by weight to 20.0% by weight with respect to the solid content. When the content of the initiator is less than 5.0% by weight, a pattern peeling off in a region exposed at a low exposure amount tends to occur, and when exceeding 20.0% by weight, the polymerization rate becomes large, but the molecular weight becomes low, resulting in weakening of the layer strength. The content of the oxime-based initiator is preferably from 7.5% by weight to 17.0% by weight, and particularly preferably from 10.0% by weight to 15.0% by weight.

The oxime-based initiator may be used by appropriately selecting from known initiators. Specific examples, as commercially available compounds, include 2-(o-benzoyloxime)-1-[4-(phenylthio)phenyl]-1,2-octanedione, and 1-(o-acetyloxime)-1-[9-ethyl-6-(2-methybenzoyl)-9H-carbazole-3-il]ethanone (both are manufactured by Ciba Specialty Chemicals).

In particular, in view of obtaining a pattern having a good shape (particularly rectangular shape) at a lower exposure amount, 1-(o-acetyloxime)-1-[9-ethyl-6-(2-methybenzoyl)-9H-carbazole-3-il]ethanone is preferable.

Other oxime-based initiators include oxime-based initiators, for example, as described in JP-A Nos. 2000-80068, 2001-233842 and the like.

Other known photopolymerization initiators may be used in combination with the above photopolymerization initiators in the composition of the invention.

Specifically, examples of the initiators include vicinal polyketoaldonyl compounds as disclosed in U.S. Pat. No. 2,367,660, α-carbonyl compounds as disclosed in U.S. Pat. Nos. 2,367,661 and 2,367,670, acyloin ethers as disclosed in U.S. Pat. No. 2,448,828, aromatic acyloin compounds substituted with an α-hydrocarbon as disclosed in U.S. Pat. No. 2,722,512, polynucleic quinone compounds as disclosed in U.S. Pat. Nos. 3,046,127 and 2,951,758, combinations of triallyl imidazole dimmer/p-aminophenyl ketone as disclosed in U.S. Pat. No. 3,549,367, or benzothiazole-based compound/trihalomethyl-s-triazine-based compound as disclosed in Japan Patent Application Publication (JP-B) No. 51-48516.

These photopolymerization initiators may further be used in combination with sensitizers and photostabilizers.

Specific examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methlyxanthone, 2-methoxyxanthone, thioxanthone, 2,4-diethylthioxanthone, acridone, 10-butyl-2-chloroacridone, benzil, dibenzalacetone, p-(dimethylamino)phenyl styryl ketone, p-(dimethylamino)phenyl-p-methyl styryl ketone, benzophenone, p-(dimethylamino)benzophenone (or Michler's ketone), p-(diethylamino)benzophenone, benzoanthrone, and benzothiazole compounds described in JP-B No. 51-48516, Tinuvin 1130 and Tinuvin 400.

In addition to the above, a thermal polymerization inhibitor is preferably added to the composition of the invention. As the thermal polymerization inhibitor, for example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole and the like are useful.

In the invention, in view of preventing a pattern peeling off, occurrence of residues during development, and thermal sagging during baking, and obtaining a pattern having a good shape (particularly, rectangular shape) even at a lower exposure amount, the following combinations are preferable:

(1) a combination of a resin (resin of the invention) containing the first structural unit represented by the above formula (1) and the second structural unit represented by the above formula (4), in which the content of the structural unit represented by formula (1) is 1.5 times or more the content of the structural unit represented by formula (4), with an oxime-based initiator;

(2) a combination of a resin (resin of the invention) containing the first structural unit represented by the above formula (1) and the second structural unit represented by the above formula (4), in which the content of the structural unit represented by formula (1) is 1.5 times or more the content of the structural unit represented by formula (4), with 2-(o-benzoyloxime)-1-[4-(phenylthio)phenyl]-1,2-octanedione and/or 1-(o-acetyloxime)-1-[9-ethyl-6-(2-methylbenzoyl)-9H-carbazole-3-il]ethanone;

(3) a combination of a resin (resin in the invention) containing the first structural unit represented by the above formula (1) and the second structural unit represented by the above formula (4), in which the content of the structural unit represented by formula (1) is 2.0 times or more the content of the structural unit represented by formula (4), with 1-(o-acetyloxime)-1-[9-ethyl-6-(2-methylbenzoyl)-9H-carbazole-3-il]ethanone;

(4) a combination of a resin (resin of the invention) with a content of from 0.1% by weight to 7.0% by weight (preferably, from 1.0 to 5.0% by weight) with respect to the total solid content of the composition, with an oxime-based initiator with a content of from 5% by weight to 20% by weight (preferably, from 10.0% by weight to 15.0% by weight) with respect to the total solid content of the composition;

(5) a combination further containing a coloring agent with a content of from 50% by weight to 80% by weight with respect to the total solid content of the composition in the above (4); and (6) a combination in which the weight-average molecular weight of the resin of the invention is from 30,000 to 300,000 in the above (4).

(D) Polymerizable Compound

The colored photosensitive composition of the present invention can be formed using at least one polymerizable compound. The composition of the invention can form a negative working composition by further using of a polymerizable compound together with the above components.

As the polymerizable compound, monomer compounds having a boiling point of 100° C. or higher under ordinary pressure, and at least one addition polymerizable ethylenic unsaturated group are preferable.

Examples of the monomer compound include monofunctional acrylates and methacrylates such as polyethylene glycol mono(meth)acrylate, polypropylene glycol mono(meth)acrylate, and phenoxyethyl(meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate;

(meth)acrylates obtained through addition of ethylene oxide or propylene oxide to a polyfunctional alcohol such as trimethylolpropane tri(acryloyloxypropyl)ether, tri(acryloyloxyethyl)isocyanurate, glycerol, or trimethylolethane; urethane acrylates described in JP-B Nos. 48-41708 and 50-6034, and JP-A No. 51-37193; polyester acrylates described in JP-A No. 48-64183, and JP-B Nos. 49-43191 and 52-30490; polyfunctional acrylates and methacrylates such as epoxy acrylates obtained by reaction between an epoxy resin and (meth)acrylic acid and mixtures thereof. Other examples include photocurable monomers and oligomers described in Journal of the Adhesion Society of Japan vol. 20, No. 7, page 300 to 308.

In addition to the above-described compounds, radical polymerizable monomers containing a carboxy group represented by the following formulae (III-1) or (III-2) are also preferred. In formulae (III-1) and (III-2), in the case where T or G is an oxyalkylene group, the end on the carbon atom side combines with R, X, or W.

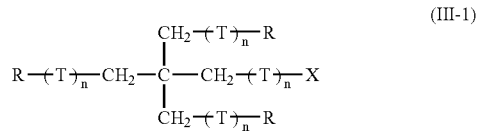

(III-1)

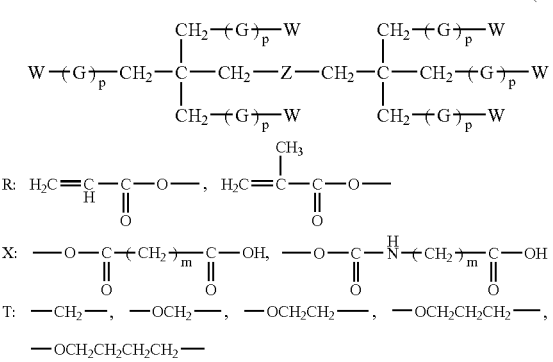
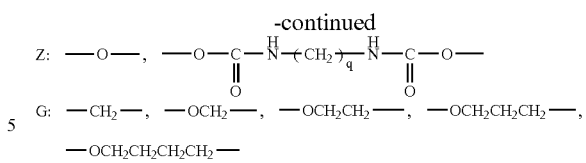

In formula (III-1), n is from 0 to 14, and m is from 1 to 8. In formula (III-2), W has the same meaning as R or X in formula (III-1), wherein three or more of the six Ws are Rs. p is from 0 to 14, and q is from 1 to 8. A plurality of Rs, Xs, Ts, and Gs in one molecule may be the same as or different from each other.

Specific examples of the radical polymerizable monomers represented by formulae (III-1) and (III-2) include those represented shown below.

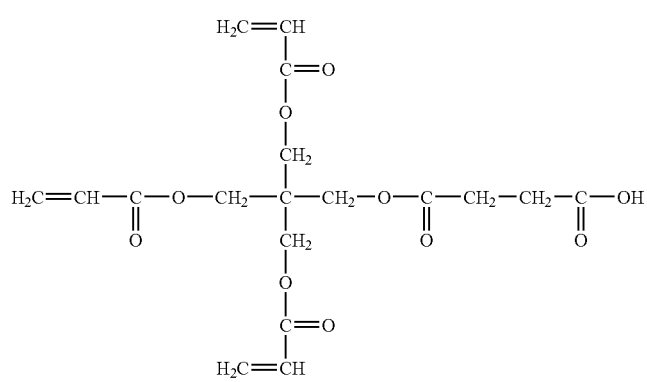

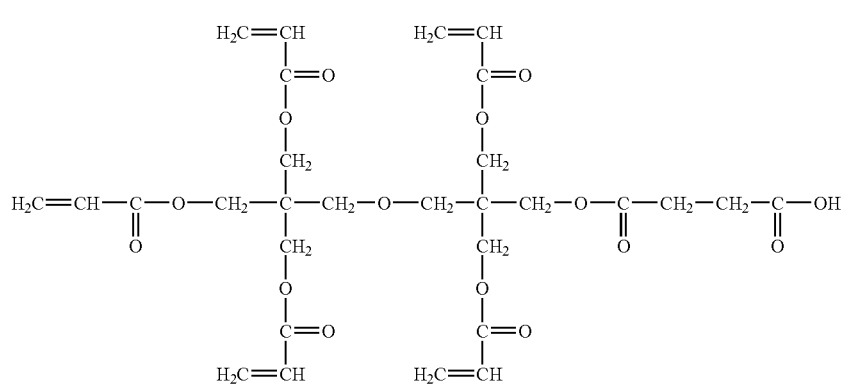

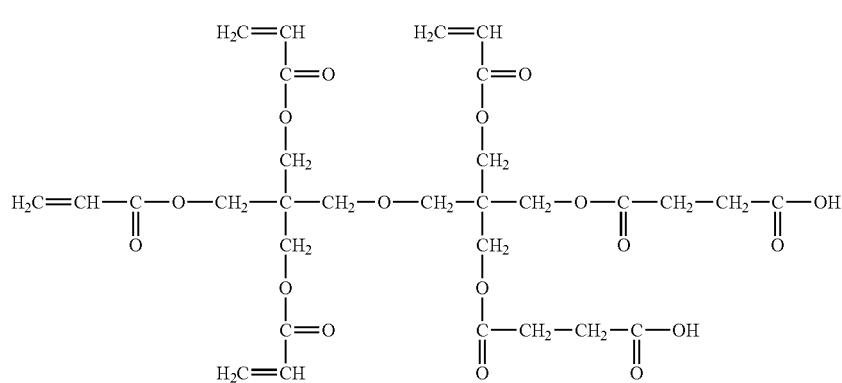

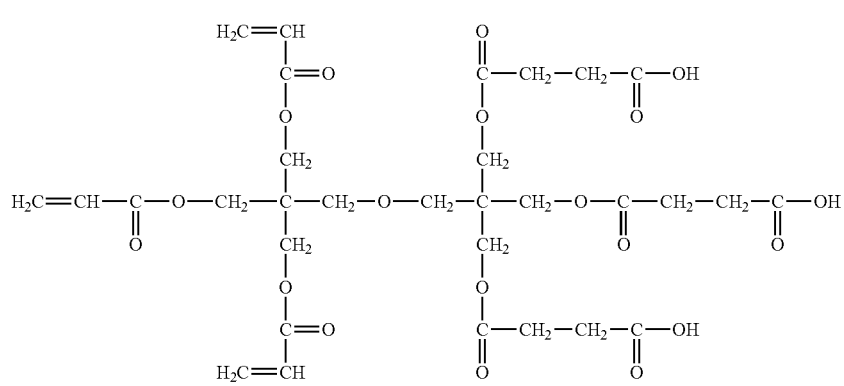
(4)
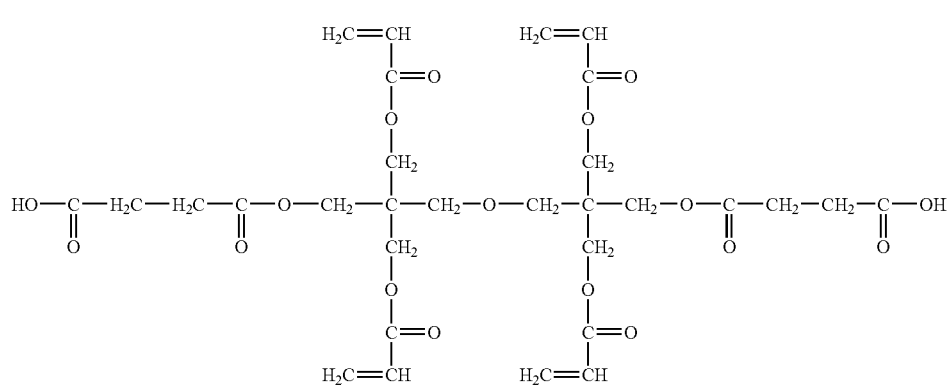
(5)
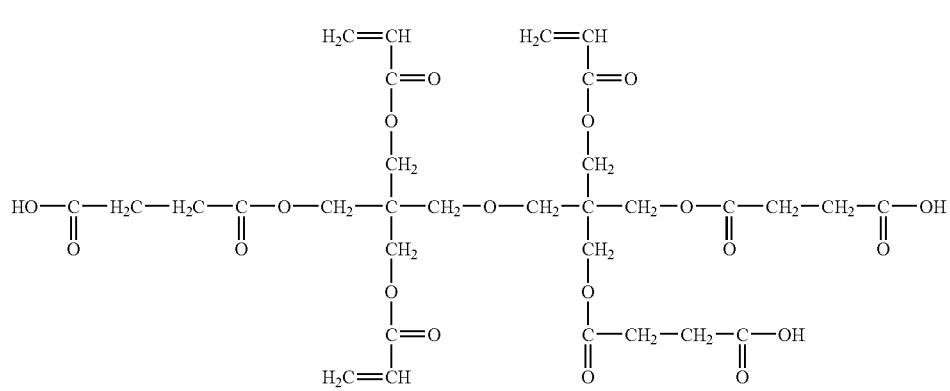
(6)
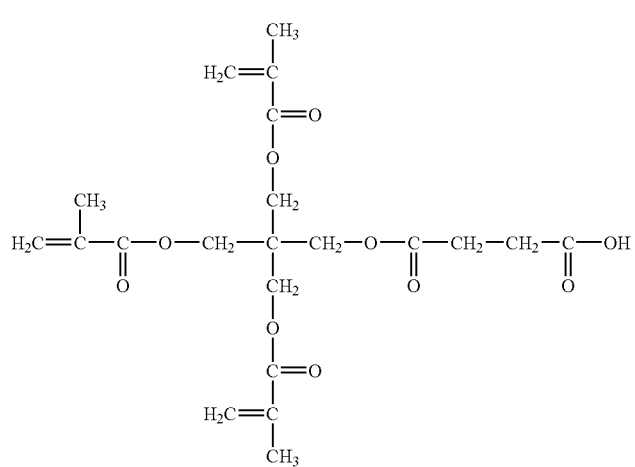
(7)

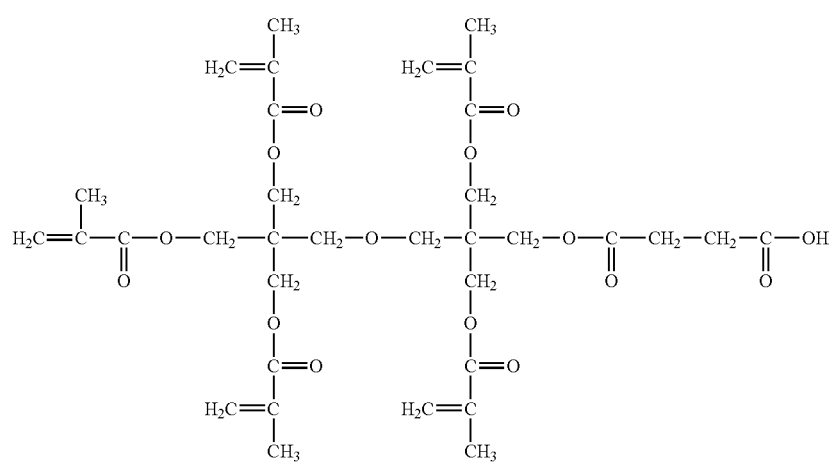
(8)
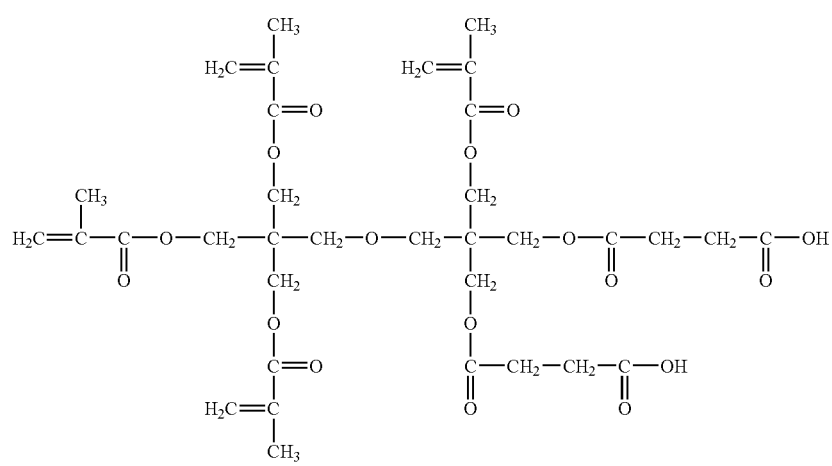
(9)
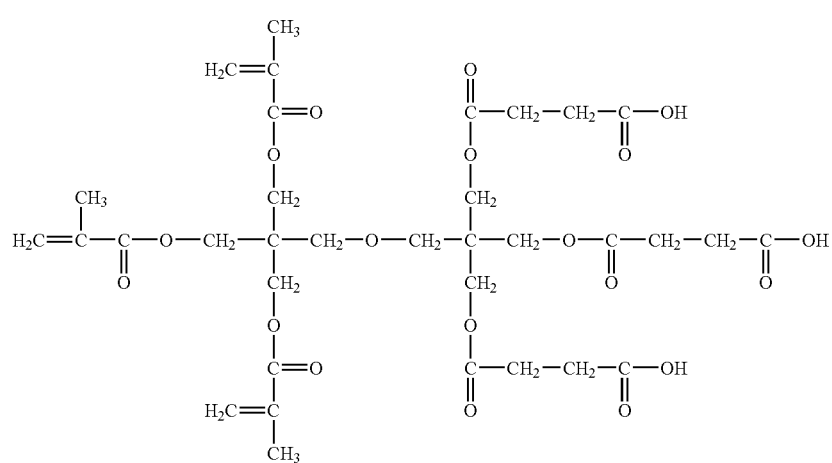
(10)

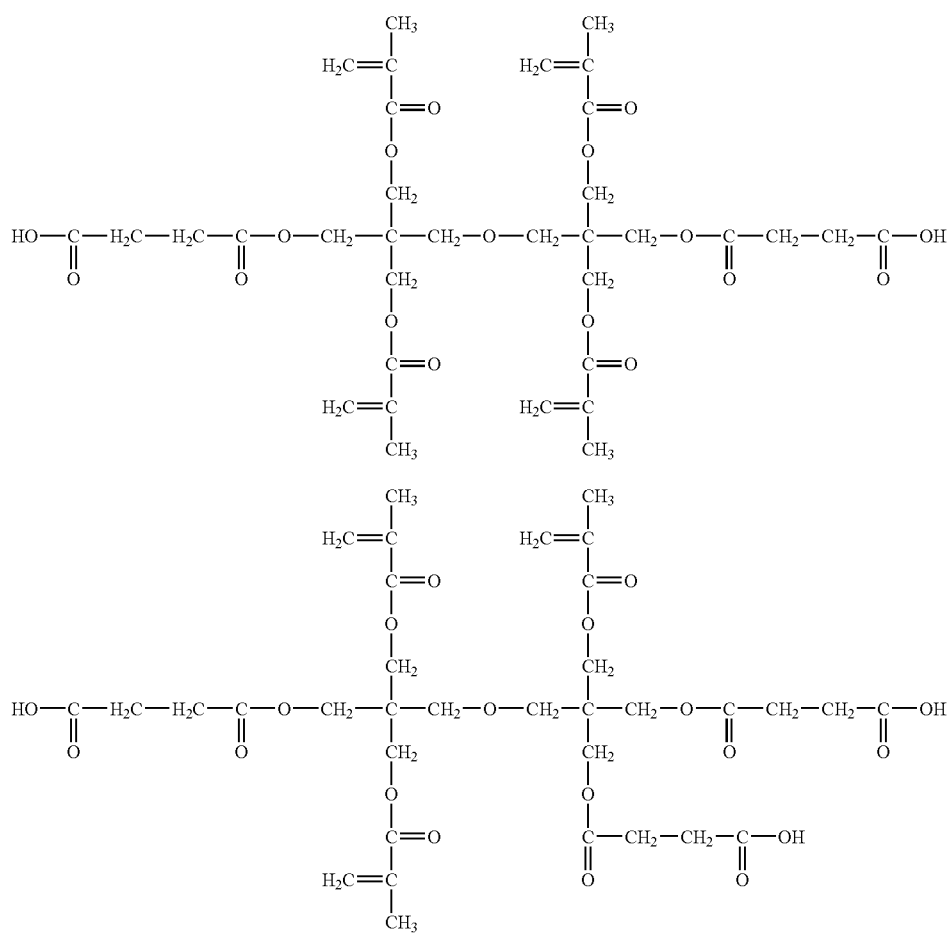

(11)

(12)

The content of the polymerizable compound in the colored photosensitive composition is preferably from 10% by weight to 45% by weight, more preferably from 12% by weight to 40% by weight, and particularly preferably from 15% by weight to 35% by weight with respect to the total solid content in the composition. When the content is within the range, sufficient cure in the exposed areas and solubility of the unexposed areas are maintained, and cure of the exposed areas can sufficiently be maintained, and extreme reduction in solubility of the unexposed areas can be prevented.

(E) Solvent

The colored photosensitive composition of the invention preferably contains a solvent. The solvent is not particularly limited as long as the solubility of the composition and coating property of the composition are satisfied, and is preferably selected in consideration of, in particular, solubility of dyes and binders, coating property, and safety.

Preferable examples of the solvent used to prepare the composition of the invention include: esters such as ethylacetate, n-butyl acetate, isobutyl acetate, amyl formate, isoamyl acetate, butyl propionate, isopropyl butylate, ethyl butyrate, butyl butyrate, alkyl esters, methyl hydroxyacetate, ethyl hydroxyacetate, butyl hydroxyacetate, methyl methoxyacetate, ethyl methoxyacetate, butyl methoxyacetate, methyl ethoxyacetate, ethyl ethoxyacetate, methyl 3-hydroxypionate, ethyl 3-hydroxypropanoate, methyl 3-methoxypropionate, ethyl 3-methoxypropionate, methyl 3-ethoxypropionate, ethyl 3-ethoxypropionnate, methyl 2-hydroxypropionate, ethyl 2-hydroxypropanoate, propyl 2-hydroxypropionate, methyl 2-methoxypropionate, ethyl 2-methoxypropionate, propyl 2-methoxypropionate, methyl 2-ethoxypropionate, ethyl 2-ethoxypropionate, methyl 2-hydroxy-2-methylpropionate, ethyl 2-hydroxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate;

ethers such as diethylene glycol dimethyl ether, tetrahydrofuran, ethylene glycol monomethyl ether, ethylene glycol monoethyl ether, methyl cellosolve acetate (ethylene glycol monomethyl ether acetate), ethyl cellosolve acetate (ethylene glycol monoethyl ether acetate), diethylene glycol monomethyl ether, diethylene glycol monoethyl ether, diethylene glycol monobutyl ether, diethylene glycol monoethyl ether acetate, diethylene glycol monobutyl ether acetate, propylene glycol methyl ether, propylene glycol methyl ether acetate, propylene glycol ethyl ether acetate, and propylene glycol propyl ether acetate; ketones such as methyl ethyl ketone, cyclohexanone, 2-heptanone, and 3-heptanone; and aromatic hydrocarbons such as toluene and xylene.

Among them, methyl 3-ethoxypropionate, ethyl 3-ethoxypropionnate, ethyl cellosolve acetate, ethyl lactate, diethylene glycol dimethyl ether, butyl acetate, methyl 3-methoxypropionate, 2-heptanone, cyclohexanone, ethylcarbitol acetate (diethylene glycol monoethyl ether acetate), butylcarbitol acetate (diethylene glycol monobutyl ether acetate), propylene glycol methyl ether, and propylene glycol methyl ether acetate are more preferred.

(F) Various Additives

The composition of the invention may contain various additives as necessary, such as a filler, polymer compound other than the above-described ones, a surfactant, an adhesion promoting agent, an antioxidant, an ultraviolet absorber, and an aggregation inhibitor.

Specific examples of the additives include: a filler such as glass or alumina; a polymer compound other than binder resins, such as polyvinyl alcohol, polyacrylic acid, polyethylene glycol monoalkyl ether, or polyfluoroalkyl acrylate; a nonionic, cationic, or anionic surfactant; an adhesion promoting agent such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, or 3-mercaptopropyltrimethoxysilane; an antioxidant such as 2,2-thiobis(4-methyl-6-t-butylphenol) and 2,6-di-t-butylphenol; an ultraviolet absorber such as 2-(3-t-butyl-5-methyl-2-hydroxyphenyl)-5-chlorobenzotriazole and alkoxybenzophenone; and an aggregation inhibitor such as sodium polyacrylate.

In order to promote alkali solubility of the unexposed areas, thereby improving developability of the composition of the invention, the composition of the invention may contain an organic carboxylic acid, preferably an organic carboxylic acid having a molecular weight as low as 1000 or less. Specific examples thereof include: aliphatic monocarboxylic acids such as formic acid, acetic acid, propionic acid, butyric acid, valeric acid, pivalic acid, caproic acid, diethylacetic acid, enanthic acid, and caprylic acid; aliphatic dicarboxylic acids such as oxalic acid, malonic acid, succinic acid, glutaric acid, adipic acid, pimelic acid, suberic acid, azelaic acid, sebacic acid, brasylic acid, methylmalonic acid, ethylmalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cumic acid, hemellitic acid, and mesitylenic acid; aromatic polycarboxylic acids such as phthalic acid, isophthalic acid, terephthalic acid, trimellitic acid, trimesic acid, mellophanic acid acid, and pyromellitic acid; and other carboxylic acid such as phenylacetic acid, hydratropic acid, hydrocinnamic acid, mandelic acid, phenylsuccinic acid, atropic acid, cinnamic acid, cinnamylideneacetic acid, coumaric acid, and umbellic acid.

<Color Filter and Method of Manufacturing Method Thereof>

The color filter of the invention is manufactured by using the colored photosensitive composition of the invention. The method of manufacturing the color filter of the invention is not specifically limited as long as the color filter is manufactured using the colored photosensitive composition of the invention. For example, the colored photosensitive composition of the invention is coated on a substrate by means of a rotary coating, extrusion coating, roll coating or the like to form a colored photosensitive composition layer, and the formed colored photosensitive composition layer is subjected to exposure through a mask, and subjected to development with a developer, so that a colored pattern can most suitably be formed on the substrate.

Further, when a color filter of the invention is manufactured, namely, in the manufacturing method of the color filter of the invention, the method may include a step of curing the formed pattern by heating and/or exposure as needed.

When the colored photosensitive composition layer is subjected to exposure, radiation rays including an ultraviolet ray such as the g-line, h-line or i-line are preferably used for the exposure.

Examples of the support include soda glass used in liquid crystal display devices, borosilicate glass such as PYREX (registered trademark), quartz glass, and these glasses having a transparent conductive film, and photoelectric conversion device substrates used in an image pick up element, such as a silicon substrate and a complementary metal oxide semiconductor (CMOS). These supports may have black stripes for isolating respective pixels.

As necessary, these supports may have thereon an undercoat layer for improving adhesion with the upper layer, preventing diffusion of substances, or planarizing the substrate surface.

As a developer used after exposure, as long as the developer can dissolve the composition of the invention while the developer does not dissolve photocured region (in the case of a negative working type, exposed region), any developers may be used. Specifically, as the developer, a combination of various organic solvents, or an aqueous alkaline solution may be used.

Examples of the organic solvent include the above-mentioned organic solvent used for preparing the composition of the invention.

The aqueous alkaline solution may be, for example, an aqueous alkaline solution containing from 0.001 to 10% by mass, preferably from 0.01 to 1% by mass of an alkaline compound such as sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, or 1,8-diazabicyclo-[5.4.0]-7-undecene.

In the case where a developing solution composed of such an aqueous alkaline solution is used, the developing solution is washed away after development.

The color filter of the invention may be used in liquid crystal display devices and solid-state image pickup devices such as and CCDs, and is particularly suitable for high resolution CCDs and CMOS devices having more than 1,000,000 pixels. The color filter of the invention is useful as, for example, a color filter for CCD, wherein the color filter is disposed between the light receiving portions of the pixels for forming the CCD and the microlens for condensing light.

EXAMPLES

The present invention is further described below in detail with reference to the following examples, but the invention is not limited to the following examples without departing from the scope of the invention. "Part" is based on mass unless otherwise noted.

Example 1

1) Preparation of Resist Liquid

The following composition were mixed and dissolved to prepare a resist solution.

| | |
|---|---|
| Propylene glycol monomethyl ether acetate (PGMEA) | 19.20 parts |
| Ethyl lactate | 36.67 parts |
| Resin | 30.51 parts |
| [40% PGMEA solution of benzyl methacrylate/ methacrylic acid/methacrylic acid-2-hydroxyethyl copolymer (molar ratio = 60:22:18)] | |
| KAYARAD DPHA | 12.20 parts |
| (manufactured by Nippon Kayaku Co., Ltd.; polymerizable compound) | |
| photopolymerization initiator (p-methoxyphenol) | 0.0061 parts |
| (manufactured by Ciba Specialty Chemicals; oxime-based initiator) | |
| Fluorine surfactant (trade name: F-475, manufactured by Dainippon Ink and Chemicals, Incorporated) | 0.83 parts |
| Photopolymerization initiator | 0.586 parts |
| (Trade name: TAZ-107, manufactured by Midori Kagaku Co., Ltd., trihalomethyl triazine photopolymerization initiator) | |

2) Preparation of Silicon Wafer with Undercoat Layer

A six-inch silicon wafer was subjected to a heat treatment in an oven at 200° C. for 30 minutes. Subsequently, the above resist liquid was coated on the silicon wafer to form a layer with a dry layer thickness of 1 μm, and the layer was heated and dried on a hot plate at 200° C. for 5 minutes to form an undercoat layer, thereby a silicon wafer with undercoat was obtained.

3) Preparation of Colored Photosensitive Composition

Composition of the Invention

The compounds of the following composition A-1 were mixed and dissolved to prepare a colored photosensitive resin composition A-1.
(Composition A-1)

| | |
|---|---|
| cyclohexanone | 80 parts |
| coloring agent A [the aforementioned exemplary compound C-1] | 8.16 parts |
| coloring agent B [the following compound a] | 3.84 parts |
| KAYARAD DPHA | 4.91 parts |
| (manufactured by Nippon Kayaku Co., Ltd.; polymerizable compound) | |
| photopolymerization initiator CGI-242 | 2.00 parts |
| (manufactured by Ciba Specialty Chemicals; oxime-based initiator) | |
| resin (the aforementioned polymer compound 1; exemplary compound of the resin of the invention) | 0.48 parts |
| dicyclohexylmethylamine | 0.61 parts |
| surfactant (manufactured by Dainippon Ink & Chemicals Inc.; F-781) | 0.02 parts |

4) Coating, Exposure and Development of Colored Photosensitive Composition

The colored photosensitive resin composition A-1 prepared in the above 3), was coated on the undercoat layer of the silicon wafer with an undercoat layer obtained by the above 2), to form a photocurable coated layer. The coated layer was subjected to a heat treatment (pre-baking) by the use of a hot plate at 100° C. for 120 seconds so as to form a coated layer having a dry layer thickness of 0.6 μm. Subsequently, the coated layer was irradiated with light at a wavelength of 365 nm through a bayer pattern mask with a pattern of 1.2 μms square at exposure amounts ranging from 100 mJ/cm$^2$ to 2,500 mJ/cm$^2$ by changing by 100 mJ/cm$^2$ by 100 mJ/cm$^2$ at a time by the use of an i-line stepper exposure apparatus FPA-3000i5+(manufactured by Canon Inc.) Thereafter, the silicon wafer on which the irradiated coated layer had been formed was placed on a horizontally rotatable table of a spin shower developing apparatus (Model DW-30 manufactured by Chemitronics Co., Ltd.), and was subjected to paddle-development using CD-2000 (manufactured by Fujifilm Electronics Materials Co., Ltd.) at 23° C. for 60 seconds to form a colored pattern on the silicon wafer.

The silicon wafer, on which the colored pattern had been formed, was secured to the horizontally rotatable table with a vacuum chuck method, was rotating speed at a rotation speed of 50 rpm by a revolution apparatus, and was subjected to a rinse treatment by supplying pure water sprayed from a spray nozzle in a shower form from above the rotation center of the table. Thereafter, the wafer was dried with spray to obtain a color filter.

(Evaluation)

In the above, the following evaluations were performed. The evaluation results are shown in the following Tables 1.

—1. Adhesiveness of Pattern after Development

The color filter obtained in the above was observed and confirmed at 500 magnifications with an optical microscope, and a minimum exposure amount (mJ/cm$^2$) required for adhering and remaining the entire pattern onto the wafer was determined as an index for evaluating the pattern adhesiveness. It shows that a better adhesiveness can be achieved at a low exposure amount as the number of the minimum exposure amount becomes smaller.

—2. Developability of Unexposed Areas—

The pattern after development was observed using a scanning type electron microscope (SEM) at 10,000 magnifications, and developability of the unexposed areas was evaluated according to the following criteria.

<Evaluation Criteria>
A: unexposed areas is completely removed;
B: Within a practically acceptable range, although little residues remain;
C: Residues remain; and
D: a large amount of residues remain, and the residues exceed an acceptable range.

—3. Rectangular Shape-Forming Property of Pattern after Post-Baking—

As described above, after the pattern obtained by exposure at a minimum exposure amount of +300 mJ/cm$^2$ was post-exposed at an exposure amount of 10,0000 mJ/cm$^2$ at 30° C., the pattern was subjected to a baking treatment on a hot plate at 230° C. for 5 minutes. The cross-sectional profile of the pattern after the baking treatment was observed using a scanning type electron microscope (SEM), and evaluated in accordance with the following criteria by viewing indexes obtained by the following equation as indications. Here, the cross-sectional profile is the shape of the cut surface when the pattern formed in a layer shape is cut by a plane perpendicular to the surface of the layer.

Index of rectangular shape-forming property (S) of pattern=line width at the cross-section of pattern at interface with substrate/line width in cross-section of pattern at face in non-contact with substrate <Evaluation Criteria>

S>1.20: The pattern profile at the cut surface is a normal taper pattern.

0.95≦S≦1.20: The pattern profile at the cut surface is a rectangular shape and favorable.

S<0.95: The pattern profile at the cut surface is a reverse taper pattern.

Examples 2-13 and Comparative Examples 1-4

Color filters were prepared in manners similar to Example 1 except that the colored photosensitive composition A-1 in Example 1 was changed to colored photosensitive composition A-2 to A-17, in which the coloring agent and the resin according to the invention in the colored photosensitive composition A-1 were changed to those shown in Table 1, respectively, and the adhesiveness of the pattern after development, the developability of unexposed areas and the rectangular shape-forming property of the pattern were evaluated. The Results of the evaluations are shown in the following Table 1.

TABLE 1

| | Colored photo-sensitive composition | Coloring agent Coloring agent A | Coloring agent B | Content | Resin Compound No. | Acid value [mgKOH/g] | Weight-average molecular weight | Content | (1-(3)/(4) ratio*1 | Initiator Kind | Initiator Content | Adhesiveness Minimum exposure amount [mJ/cm²] | Developability for unexposed areas | Rectangular shape-forming property of pattern |
|---|---|---|---|---|---|---|---|---|---|---|---|---|---|---|
| Example 1 | A-1 | Exemplary Compd. C-1 | a | 60% | Polymer compound 1 | 54 | 85,000 | 2.4% | 2.00 | CGI-242 | 10.0% | 300 | A | 1.07 |
| Example 2 | A-2 | Exemplary Compd. C-5 | f | 60% | Polymer compound 3 | 34 | 62,000 | 2.4% | 3.50 | CGI-2.42 | 10.0% | 200 | A | 1.07 |
| Example 3 | A-3 | Exemplary Compd. C-6 | b | 60% | Polymer compound 5 | 43 | 31,000 | 2.4% | 1.53 | CGI-242 | 10.0% | 300 | A | 1.18 |
| Example 4 | A-4 | Exemplary Compd. C-25 | d | 60% | Polymer compound 7 | 40 | 100,000 | 2.4% | 5.67 | CGI-242 | 10.0% | 100 | A | 1.02 |
| Example 5 | A-5 | Exemplary Compd. C-58 | c | 60% | Polymer compound 17 | 45 | 48,000 | 2.4% | 4.00 | CGI-242 | 10.0% | 100 | A | 1.01 |
| Example 6 | A-6 | e | f | 60% | Polymer compound 6 | 31 | 23,000 | 2.4% | 5.00 | CGI-242 | 10.0% | 200 | A | 1.06 |
| Example 7 | A-7 | C.I. Acid Red 57 | f | 60% | Polymer compound 10 | 16 | 36,000 | 2.4% | 15.00 | CGI-242 | 10.0% | 200 | B | 1.07 |
| Example 8 | A-8 | C.I. Acid Blue 249 | b | 60% | Polymer compound 12 | 47 | 28,000 | 2.4% | 2.00 | CGI-242 | 10.0% | 400 | A | 1.16 |
| Example 9 | A-9 | C.I. Acid Blue 249 | d | 60% | Polymer compound 18 | 58 | 27,000 | 2.4% | 3.25 | CGI-242 | 10.0% | 500 | A | 1.07 |
| Example 10 | A-10 | C.I. Acid Blue 249 | d | 60% | Polymer compound 19 | 55 | 35,000 | 2.4% | 2.00 | CGI-242 | 10.0% | 400 | B | 1.07 |
| Example 11 | A-11 | C.I. Acid Blue 249 | d | 60% | Polymer compound 20 | 52 | 60,000 | 2.4% | 2.00 | CGI-242 | 10.0% | 300 | B | 1.08 |
| Example 12 | A-12 | C.I. Acid Blue 249 | d | 60% | Polymer compound 21 | 29 | 30,000 | 2.4% | 5.00 | CGI-242 | 10.0% | 400 | C | 1.05 |
| Example 13 | A-13 | C.I. Pigment Green 7 | C.I. Pigment Yellow 83 | 60% | Polymer compound 15 | 15 | 30,000 | 2.4% | 6.00 | CGI-242 | 10.0% | 400 | C | 1.15 |
| Comp. Example 1 | A-14 | C.I. Acid Blue 249 | a | 60% | g | 31 | 32,000 | 2.4% | 0.00 | CGI-242 | 10.0% | 1,500 | A | 0.94 |
| Comp. Example 2 | A-15 | C.I. Acid Blue 249 | a | 60% | h | 30 | 53,000 | 2.4% | — | CGI-242 | 10.0% | 100 | D | 1.82 |

TABLE 1-continued

| | Colored photo-sensitive composition | Coloring agent | | | Resin | | | | | | Adhesiveness Minimum exposure amount [mJ/cm²] | Developability for unexposed areas | Rectangular shape-forming property of pattern |
|---|---|---|---|---|---|---|---|---|---|---|---|---|---|
| | | Coloring agent A | Coloring agent B | Content | Compound No. | Acid value [mgKOH/g] | Weight-average molecular weight | Content | (1-(3)/(4) ratio*1 | Initiator Kind | Content | | | |
| Comp. Example 3 | A-16 | C.I. Acid Blue 249 | a | 60% | I | 45 | 72,000 | 2.4% | 1.33 | CGI-242 | 10.0% | 200 | A | 1.31 |
| Comp. Example 4 | A-17 | C.I. Acid Blue 249 | a | 60% | Not added | — | — | — | — | CGI-242 | 10.0% | 2,500 | A | 1.40 |

Note: *1; The ratio of the first structural unit represented by formulae (1)-(3) to the second structural unit represented by formula (4)

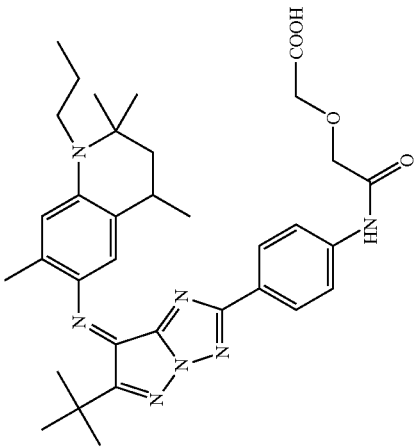

a

TABLE 1-continued

| Colored photo-sensitive composition | Coloring agent | | | Resin | | | | Initiator | | Adhesiveness Minimum exposure amount [mJ/cm²] | Developability for unexposed areas | Rectangular shape-forming property of pattern |
|---|---|---|---|---|---|---|---|---|---|---|---|---|
| | Coloring agent A Content | Coloring agent B Content | Compound No. | Acid value [mgKOH/g] | Weight-average molecular weight | Content | (1-(3)/(4) ratio*1 | Kind | Content | | | |

TABLE 1-continued

| | Coloring agent | | | Resin | | | | Adhesiveness Minimum exposure amount [mJ/cm²] | Developability for unexposed areas | Rectangular shape-forming property of pattern |
|---|---|---|---|---|---|---|---|---|---|---|
| Colored photo-sensitive composition | Coloring agent A Compound No. | Coloring agent B Content | Content | Acid value [mgKOH/g] | Weight-average molecular weight | Content | (1-3)/(4) ratio*1 | Initiator Kind Content | | | | d e

TABLE 1-continued

| | Resin | | | | | | Adhesiveness Minimum exposure amount [mJ/cm²] | Developability for unexposed areas | Rectangular shape-forming property of pattern |
|---|---|---|---|---|---|---|---|---|---|
| Colored photo-sensitive composition | Coloring agent | | | Acid value [mgKOH/g] | Weight-average molecular weight | Content | (1-(3)/(4)) ratio*1 | Initiator Kind Content | |
| | Coloring agent A | Coloring agent B | Content | Compound No. | | | | | |

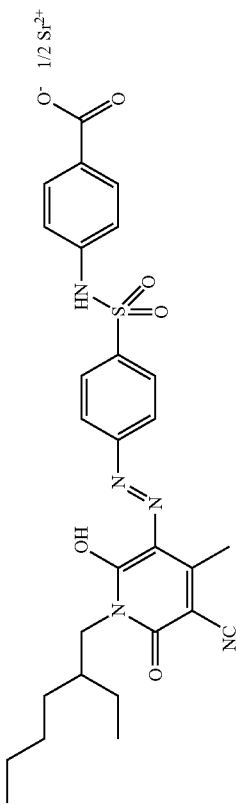

f

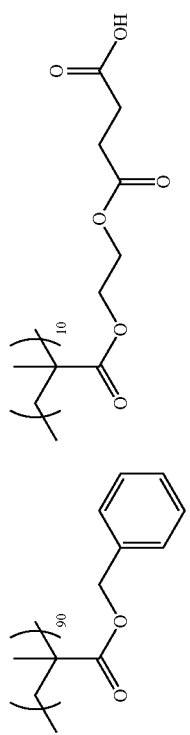

g
Mw: 32,000
31 mgKOH/g

TABLE 1-continued

| | Resin | | | | | | | | Adhesiveness Minimum exposure amount [mJ/cm²] | Developability for unexposed areas | Rectangular shape-forming property of pattern |
|---|---|---|---|---|---|---|---|---|---|---|---|
| Colored photo-sensitive composition | Coloring agent | | | | Acid value [mgKOH/g] | Weight-average molecular weight | Content | (1-(3)/(4) ratio*1 | Initiator | | |
| | Coloring agent A | Coloring agent B | Content | Compound No. | | | | | Kind | Content | |

(Structural formulas shown:)

h
Mw: 53,000
30 mgKOH/g i
Mw: 72,000
45 mgKOH/g

Examples 14-16, and Comparative Examples 5-12

Color filters were prepared in manners similar to Example 1 except that in the colored photosensitive composition A-1 in Example 1, the coloring agent, the resin of the invention, and the initiator in the colored photosensitive composition A-1 were changed to those in the colored photosensitive compositions A-18-A-28 as shown in Tables 2A and 2B, respectively, and the adhesiveness of the pattern after development, the developability of unexposed areas and the rectangular shape property of the pattern were evaluated. The Results of evaluations are shown in following Table 2.

—Colored Photosensitve Composition A-18—

The compounds of the following composition A-18 were mixed and dissolved to prepare a colored photosensitive composition A-18.

(Composition A-18)

| | |
|---|---|
| cyclohexanone | 80 parts |
| coloring agent A [the aforementioned exemplary compound C-53] | 6.80 parts |
| coloring agent B [the following exemplary compound a] | 3.20 parts |
| KAYARAD DPHA (manufactured by Nippon Kayaku Co., Ltd.; polymerizable compound) | 6.89 parts |
| photopolymerization initiator CGI-242 (manufactured by Ciba Specialty Chemicals) | 2.00 parts |
| resin (the aforementioned polymer compound 15) | 0.48 parts |
| dicyclohexyl methylamine | 0.61 parts |
| surfactant (manufactured by Dainippon Ink & Chemicals Inc.; F-781) | 0.02 parts |

—Colored Photosensitve Resin Composition A-19—

The compounds of the following composition A-19 were mixed and dissolved to prepare a colored photosensitive resin composition A-19.

(Composition A-19)

| | |
|---|---|
| cyclohexanone | 80 parts |
| coloring agent A [the aforementioned exemplary compound C-53] | 10.88 parts |
| coloring agent B [the following exemplary compound a] | 5.12 parts |
| KAYARD DPHA (manufactured by Nippon Kayaku Co., Ltd.; polymerizable compound) | 1.89 parts |
| photopolymerization initiator CGI-242 (manufactured by Ciba Specialty Chemicals) | 1.00 parts |
| resin (the aforementioned polymer compound 15) | 0.78 parts |
| dicyclohexylmethylamine | 0.31 parts |
| surfactant (manufactured by Dainippon Ink & Chemicals Inc.; F-781) | 0.02 parts |

—Colored Photosensitve Composition A-20—

The compounds of the following composition A-20 were mixed and dissolved to prepare a colored photosensitive composition A-20.

(Composition A-20)

| | |
|---|---|
| cyclohexanone | 80 parts |
| coloring agent A [the aforementioned exemplary compound C-1] | 8.16 parts |
| coloring agent B [the following exemplary compound a] | 3.84 parts |
| KAYARAD DPHA (manufactured by Nippon Kayaku Co., Ltd.; polymerizable compound) | 4.91 parts |
| photopolymerization initiator CGI-124 (manufactured by Ciba Specialty Chemicals; oxime-based initiator) | 2.00 parts |
| resin (the aforementioned polymer compound 1; exemplary resin compound of the invention) | 0.48 parts |
| dicyclohexyl methylamine | 0.61 parts |
| surfactant (manufactured by Dainippon Ink & Chemicals Inc.; F-781) | 0.02 parts |

—Colored Photosensitve Composition A-21—

The compounds of the following composition A-21 were mixed and dissolved to prepare a colored photosensitive composition A-21.

(Composition A-21)

| | |
|---|---|
| cyclohexanone | 80 parts |
| coloring agent A [the aforementioned exemplary compound C-53] | 6.12 parts |
| coloring agent B [the following exemplary compound a] | 2.88 parts |
| KAYARAD DPHA (manufactured by Nippon Kayaku Co., Ltd.; polymerizable compound) | 7.89 parts |
| photopolymerization initiator CGI-242 (manufactured by Ciba Specialty Chemicals) | 2.00 parts |
| resin (the aforementioned polymer compound 15) | 0.48 parts |
| dicyclohexylmethylamine | 0.61 parts |
| surfactant (manufactured by Dainippon Ink & Chemicals Inc.; F-781) | 0.02 parts |

—Colored Photosensitve Composition A-22—

The compounds of the following composition A-22 were mixed and dissolved to prepare a colored photosensitive composition A-22.

(Composition A-22)

| | |
|---|---|
| cyclohexanone | 80 parts |
| coloring agent A [the aforementioned exemplary compound C-53] | 6.12 parts |
| coloring agent B [the following exemplary compound a] | 2.88 parts |
| KAYARD DPHA (manufactured by Nippon Kayaku Co., Ltd.; polymerizable compound) | 8.37 parts |
| photopolymerization initiator CGI-242 (manufactured by Ciba Specialty Chemicals) | 2.00 parts |
| dicyclohexyl methylamine | 0.61 parts |
| surfactant (manufactured by Dainippon Ink & Chemicals Inc.; F-781) | 0.02 parts |

—Colored Photosensitve Composition A-23—

The compounds of the following composition A-23 were mixed and dissolved to prepare a colored photosensitive composition A-23.

(Composition A-23)

| | |
|---|---|
| cyclohexanone | 80 parts |
| coloring agent A [the aforementioned exemplary compound C-53] | 6.80 parts |
| coloring agent B [the following exemplary compound a] | 3.20 parts |
| KAYARAD DPHA (manufactured by Nippon Kayaku Co., Ltd.; polymerizable compound) | 7.91 parts |
| photopolymerization initiator CGI-242 (manufactured by Ciba Specialty Chemicals) | 0.96 parts |
| resin (the aforementioned polymer compound 15) | 0.50 parts |

—continued

| | |
|---|---|
| dicyclohexyl methylamine | 0.61 parts |
| surfactant (manufactured by Dainippon Ink & Chemicals Inc.; F-781) | 0.02 parts |

—Colored Photosensitve Composition A-24—

The compounds of the following composition A-24 were mixed and dissolved to prepare a colored photosensitive composition A-24.

(Composition A-24)

| | |
|---|---|
| cyclohexanone | 80 parts |
| coloring agent A [the aforementioned exemplary compound C-53] | 10.88 parts |
| coloring agent B [the following exemplary compound a] | 5.12 parts |
| KAYARAD DPHA (manufactured by Nippon Kayaku Co., Ltd.; polymerizable compound) | 2.21 parts |
| photopolymerization initiator CGI-242 (manufactured by Ciba Specialty Chemicals) | 0.96 parts |
| resin (the aforementioned polymer compound 15) | 0.50 parts |
| dicyclohexylmethylamine | 0.31 parts |
| surfactant (manufactured by Dainippon Ink & Chemicals Inc.; F-781) | 0.02 parts |

—Colored Photosensitve Composition A-25—

The compounds of the following composition A-25 were mixed and dissolved to prepare a colored photosensitive composition A-25.

(Composition A-25)

| | |
|---|---|
| cyclohexanone | 80 parts |
| coloring agent A [the aforementioned exemplary compound C-53] | 11.22 parts |
| coloring agent B [the following exemplary compound a] | 5.28 parts |
| KAYARAD DPHA (manufactured by Nippon Kayaku Co., Ltd.; polymerizable compound) | 1.67 parts |
| photopolymerization initiator CGI-242 (manufactured by Ciba Specialty Chemicals) | 1.00 part |
| resin (the aforementioned polymer compound 15) | 0.50 parts |
| dicyclohexyl methylamine | 0.31 parts |
| surfactant (manufactured by Dainippon Ink & Chemicals Inc.; F-781) | 0.02 parts |

—Colored Photosensitve Composition A-26—

The compounds of the following composition A-26 were mixed and dissolved to prepare a colored photosensitive composition A-26.

(Composition A-26)

| | |
|---|---|
| cyclohexanone | 80 parts |
| coloring agent A [the aforementioned exemplary compound C-53] | 11.22 parts |
| coloring agent B [the following exemplary compound a] | 5.28 parts |
| KAYARAD DPHA (manufactured by Nippon Kayaku Co., Ltd.; polymerizable compound) | 2.17 parts |
| photopolymerization initiator CGI-242 (manufactured by Ciba Specialty Chemicals) | 1.00 part |
| dicyclohexylmethylamine | 0.31 parts |
| surfactant (manufactured by Dainippon Ink & Chemicals Inc.; F-781) | 0.02 parts |

—Colored Photosensitve Composition A-27—

The compounds of the following composition A-27 were mixed and dissolved to prepare a colored photosensitive composition A-27.

(Composition A-27)

| | |
|---|---|
| cyclohexanone | 80 parts |
| coloring agent A [the aforementioned exemplary compound C-53] | 8.16 parts |
| coloring agent B [the following exemplary compound a] | 3.84 parts |
| KAYARAD DPHA (manufactured by Nippon Kayaku Co., Ltd.; polymerizable compound) | 2.69 parts |
| photopolymerization initiator CGI-242 (manufactured by Ciba Specialty Chemicals) | 4.20 part |
| resin (the aforementioned polymer compound 15) | 0.48 parts |
| dicyclohexylmethylamine | 0.61 parts |
| surfactant (manufactured by Dainippon Ink & Chemicals Inc.; F-781) | 0.02 parts |

—Colored Photosensitve Composition A-28—

The compounds of the following composition A-28 were mixed and dissolved to prepare a colored photosensitive composition A-28.

(Composition A-28)

| | |
|---|---|
| cyclohexanone | 80 parts |
| coloring agent A [the aforementioned exemplary compound C-53] | 8.16 parts |
| coloring agent B [the following exemplary compound a] | 3.84 parts |
| KAYARAD DPHA (manufactured by Nippon Kayaku Co., Ltd.; polymerizable compound) | 4.89 parts |
| Titanocen | 0.27 parts |
| 4,4'-bis(diethylamino)benzophenone | 1.73 parts |
| resin (the aforementioned polymer compound 15) | 0.48 parts |
| dicyclohexylmethylamine | 0.61 parts |
| surfactant (manufactured by Dainippon Ink & Chemicals Inc.; F-781) | 0.02 parts |

TABLE 2

| | Colored photo-sensitive composition | Coloring agent | | | Resin | | | (1)-(3)/ (4) ratio *1 |
|---|---|---|---|---|---|---|---|---|
| | | Coloring agent A | Coloring agent B | Content | Compound No. | Acid value [mgKOH/g] | Weight-average molecular weight | Content |
| Example 14 | A-18 | Exemplary Compd. C-53 | a | 50% | Polymer compound 15 | 15 | 30,000 | 2.4% | 6.00 |
| Example 15 | A-19 | Exemplary Compd. C-53 | a | 80% | Polymer compound 15 | 15 | 30,000 | 3.9% | 6.00 |
| Example 16 | A-20 | Exemplary Compd. C-1 | a | 60% | Polymer compound 1 | 54 | 85,000 | 2.4% | 2.00 |

TABLE 2-continued

| | | | | | | | | | |
|---|---|---|---|---|---|---|---|---|---|
| Comp. Ex. 5 | A-21 | Exemplary Compd. C-53 | a | 45% | Polymer compound 15 | 15 | 30,000 | 2.4% | 6.00 |
| Comp. Ex. 6 | A-22 | Exemplary Compd. C-53 | a | 45% | Not added | — | — | — | — |
| Comp. Ex. 7 | A-23 | Exemplary Compd. C-53 | a | 50% | Polymer compound 15 | 15 | 30,000 | 2.5% | 6.00 |
| Comp. Ex. 8 | A-24 | Exemplary Compd. C-53 | a | 80% | Polymer compound 15 | 15 | 30,000 | 2.5% | 6.00 |
| Comp. Ex. 9 | A-25 | Exemplary Compd. C-53 | a | 82.5% | Polymer compound 15 | 15 | 30,000 | 2.5% | 6.00 |
| Comp. Example 10 | A-26 | Exemplary Compd. C-53 | a | 82.5% | Not added | — | — | — | — |
| Comp. Example 11 | A-27 | Exemplary Compd. C-53 | a | 60% | Polymer compound 15 | 15 | 30,000 | 2.4% | 6.00 |
| Comp. Example 12 | A-28 | Exemplary Compd. C-53 | a | 60% | Polymer compound 15 | 15 | 30,000 | 2.4% | 6.00 |

| | Initiator | | Adhesiveness Minimum exposure amount [mJ/cm$^2$] | Developability in unexposed areas | Rectangular shape-forming property |
|---|---|---|---|---|---|
| | Kind | Content | | | |
| Example 14 | CGI-242 | 10.0% | 100 | B | 1.01 |
| Example 15 | CGI-242 | 5.0% | 500 | B | 0.98 |
| Example 16 | CGI-242 | 10.0% | 500 | A | 1.10 |
| Comp. Ex. 5 | CGI-242 | 10.0% | 100 | A | 1.01 |
| Comp. Ex. 6 | CGI-242 | 4.8% | 300 | A | 0.99 |
| Comp. Ex. 7 | CGI-242 | 4.8% | 600 | B | 0.94 |
| Comp. Ex. 8 | CGI-242 | 4.8% | 1,500 | B | 0.90 |
| Comp. Ex. 9 | CGI-242 | 5.0% | 2,500 | C | 1.13 |
| Comp. Example 10 | CGI-242 | 5.0% | >2,500 | A | — |
| Comp. Example 11 | CGI-242 | 21.0% | 600 | B | 1.20 |
| Comp. Example 12 | *2 | 10.0% | 1,500 | D | 1.25 |

Note:
*1; The ratio of the first structural unit represented by formulae (1)-(3) to the second structural unit represented by formula (4)
*2; Titanocen + 1,1'-bis(diethylamino)benzophenone
Comp. Ex.; Comparative Example As shown in Table 1 and Table 2, in Examples, the color filters with a good adhesiveness were obtained even in the case of a low exposure amount, and residues were suppressed, and a good rectangular pattern was maintained after post-baking. In contrast, in Comparative Examples, color filters with a good adhesiveness were not obtained at a low exposure amount, and it was difficult to form a good rectangular pattern. Further, in Comparative Example 5, a good adhesiveness and a good pattern were obtained, although the amount of the coloring agent is small.

According to the invention, there is provided a colored photosensitive composition capable of preventing occurrence of a pattern peeling off and occurrence of residues during development (particularly, even if exposure is performed at a low exposure amount), and preventing collapse of a pattern during post-baking, and capable of providing a rectangular pattern, when the pattern (for example, a pattern with a small size (for example, 1.5 μm or less), particularly, Bayer pattern with a small size) is formed with an increased content of the coloring agents, as well as a color filter having an excellent color hue and high definition, and a method for manufacturing the color filter.

The invention includes the following embodiments.

<1> A colored photosensitive composition comprising: a coloring agent with a content of from 50% by weight to 80% by weight with respect to the total solid content of the composition; an oxime-based initiator with a content of from 5% by weight to 20% by weight with respect to the total solid content of the composition; and a resin containing at least one first structural unit represented by any one of the following formulae (1) to (3) containing an unsaturated double bond, and at least one second structural unit represented by the following formula (4) containing an acid group, wherein a ratio of the first structural unit to the second structural unit is 1.5 or more (molar ratio);

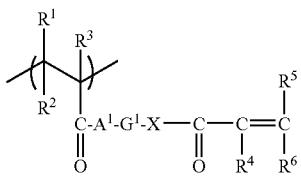

Formula (1)

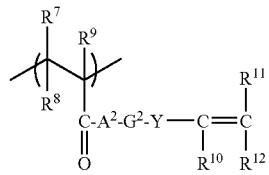

Formula (2)

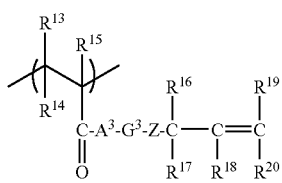

Formula (3)

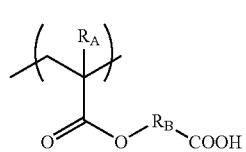

Formula (4)

wherein $A^1$, $A^2$ and $A^3$ each independently represent an oxygen atom, a sulfur atom or —N($R^{21}$)—, in which $R^{21}$ represents a substituted or unsubstituted alkyl group; $G^1$, $G^2$ and $G^3$ each independently represent a divalent organic group; X and Z each independently represent an oxygen atom, a sulfur atom or —N($R^{22}$)—, in which $R^{22}$ represents a substituted or unsubstituted alkyl group; Y represents an oxygen atom, a sulfur atom, a substituted or unsubstituted phenylene group, or —N($R^{23}$)—, in which $R^{23}$ represents a substituted or unsubstituted alkyl group; $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, and $R^{20}$ each independently represent a monovalent substituent; $R_A$ represents a hydrogen atom or an alkyl group having 1 to 6 carbon atoms; and $R_B$ represents a divalent linking group.

<2> The colored photosensitive composition according to item <1>, wherein the weight average molecular weight of the resin is from 30,000 to 300,000.

<3> The colored photosensitive composition according to any one of items <1> to <2>, wherein all of the coloring agent is an organic solvent soluble dye.

<4> The colored photosensitive composition according to any one of items <1> to <3>, wherein the colored photosensitive composition further comprises a polymerizable compound, and constitutes a negative working composition.

<5> The colored photosensitive composition according to any one of items <1> to <4>, wherein the acid value of the resin is from 5 mgKOH/g to 70 mgKOH/g.

<6> A method for manufacturing a color filter comprising: forming a colored photosensitive composition layer by coating the colored photosensitive composition according to any one of items <1> to <5> on a substrate; exposing the colored photosensitive composition layer through a mask and developing the colored photosensitive composition to form a pattern on the substrate.

<7> A color filter formed by using the colored photosensitive composition according to any one of items <1> to <5>.

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. A colored photosensitive composition comprising:
a coloring agent with a content of from 50% by weight to 80% by weight with respect to the total solid content of the composition;
an oxime-based initiator with a content of from 5% by weight to 20% by weight with respect to the total solid content of the composition; and
a resin containing at least one first structural unit represented by any one of the following formulae (1) to (3) containing an unsaturated double bond, and at least one second structural unit represented by the following formula (4) containing an acid group, wherein a ratio of the first structural unit to the second structural unit is 1.5 or more (molar ratio);

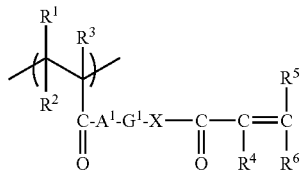

Formula (1)

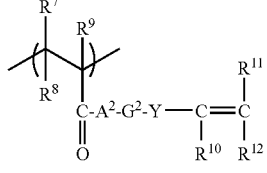

Formula (2)

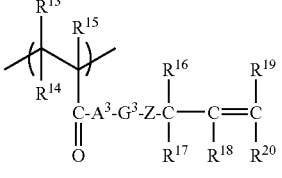

Formula (3)

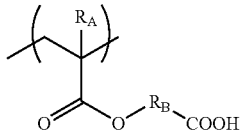

Formula (4)

wherein $A^1$, $A^2$ and $A^3$ each independently represent an oxygen atom, a sulfur atom or —N($R^{21}$)—, in which $R^{21}$ represents a substituted or unsubstituted alkyl group; $G^1$, $G^2$ and $G^3$ each independently represent a divalent organic group; X and Z each independently represent an oxygen atom, a sulfur atom or —N($R^{22}$)—, in which $R^{22}$ represents a substituted or unsubstituted alkyl group; Y represents an oxygen atom, a sulfur atom, a substituted or unsubstituted phenylene group, or —N($R^{23}$)—, in which $R^{23}$ represents a substituted or unsubstituted alkyl group; $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, $R^{19}$, and $R^{20}$ each independently represent a monovalent substituent; $R_A$ represents a hydrogen atom or an alkyl group having 1 to 6 carbon atoms; and $R_B$ represents a divalent linking group.

2. The colored photosensitive composition according to claim 1, wherein the weight average molecular weight of the resin is from 30,000 to 300,000.

3. The colored photosensitive composition according to claim 1, wherein all of the coloring agent is an organic solvent soluble dye.

4. The colored photosensitive composition according to claim 2, wherein all of the coloring agent is an organic solvent soluble dye.

5. The colored photosensitive composition according to claim 1, wherein the colored photosensitive composition further comprises a polymerizable compound, and constitutes a negative working composition.

6. The colored photosensitive composition according to claim 2, wherein the colored photosensitive composition further comprises a polymerizable compound, and constitutes a negative working composition.

7. The colored photosensitive composition according to claim 3, wherein the colored photosensitive composition further comprises a polymerizable compound, and constitutes a negative working composition.

8. The colored photosensitive composition according to claim 1, wherein an acid value of the resin is from 5 mg KOH/g to 70 mg KOH/g.

9. A method for manufacturing a color filter comprising:
forming a colored photosensitive composition layer by coating the colored photosensitive composition according to claim 1 on a substrate;
exposing the colored photosensitive composition layer through a mask and developing the colored photosensitive composition layer to form a pattern on the substrate.

10. A color filter formed by using the colored photosensitive composition according to claim 1.

11. A color filter formed by using the method for manufacturing a color filter according to claim 9.

12. The colored photosensitive composition according to claim 1, wherein the coloring agent is a phthalocyanine dye represented by Formula (I):

an acyl group, a hydroxy group, an aliphatic oxy group, an aryloxy group, an acyloxy group, a carbamoyloxy group, a heterocyclic oxy group, an aliphatic oxycarbonyloxy group, an N-alkylacylamino group, a carbamoylamino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group, or a heterocyclic thio group;

$Zc_1$ represents a group of nonmetal atoms necessary for forming a six-membered ring with carbon atoms, wherein the four $Zc_1$s may be identical or different from each other;

M represents two hydrogen atoms, a divalent metal atom, a divalent metal oxide, a divalent metal hydroxide, or a divalent metal chloride;

cm represents 0, 1, or 2, and cn represents 0 or an integer of from 1 to 5, wherein the four cns may be identical or different from each other, at least one cn represents an integer of from 1 to 5, and a plurality of $Rc_1$s in the molecule may be identical or different from each other;

cr1, cr2, cr3, and cr4 each represents 0 or 1, and satisfy cr1+cr2+cr3+cr4≧1.

13. The colored photosensitive composition according to claim 1, wherein the oxime-based initiator is selected from

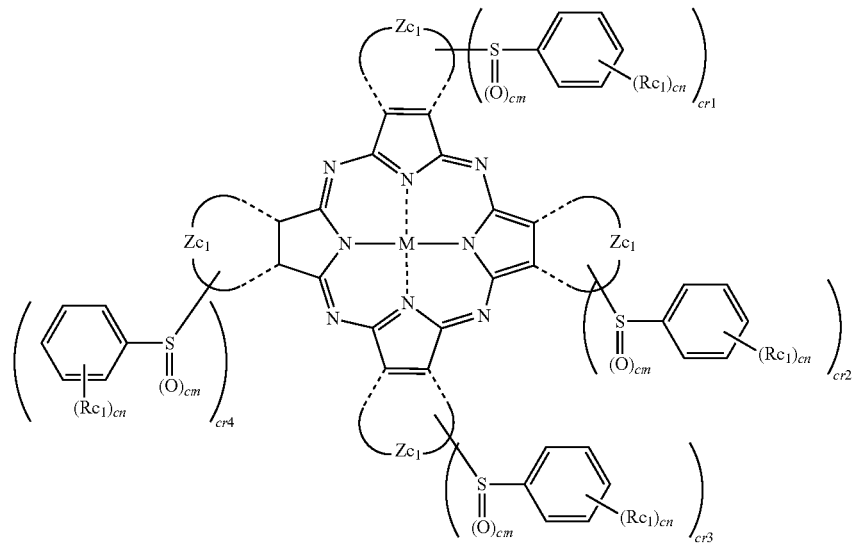

Formula (I)

wherein in Formula (I), $Rc_1$ represents a halogen atom, an aliphatic group, an aryl group, a heterocyclic group, a cyano group, a carboxy group, a carbamoyl group, an aliphatic oxycarbonyl group, an aryloxycarbonyl group, the group consisting of 2-(o-benzoyloxime)-1-[4-(phenylthio)phenyl]-1,2-octanedione and 1-(o-acetyloxime)-1-[9-ethyl-6-(2-methylbenzoyl)-9H-carbazole-3-il]ethanone.

* * * * *